(12) United States Patent
Kim et al.

(10) Patent No.: US 12,473,490 B2
(45) Date of Patent: Nov. 18, 2025

(54) ORGANIC LIGHT EMITTING DEVICE AND DISPLAY DEVICE USING THE SAME

(71) Applicant: LG Display Co., Ltd., Seoul (KR)

(72) Inventors: Gyeong-Woo Kim, Seoul (KR); Hong-Seok Choi, Seoul (KR); Seung-Ryong Joung, Seoul (KR); Yoon-Deok Han, Yongin-si (KR); Jun-Ho Lee, Seoul (KR); Ji-Seon Jang, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 331 days.

(21) Appl. No.: 18/342,585

(22) Filed: Jun. 27, 2023

(65) Prior Publication Data

US 2023/0345748 A1 Oct. 26, 2023

Related U.S. Application Data

(63) Continuation of application No. 17/096,616, filed on Nov. 12, 2020, now Pat. No. 11,730,006.

(30) Foreign Application Priority Data

Nov. 15, 2019 (KR) .................. 10-2019-0147065

(51) Int. Cl.
| | |
|---|---|
| *C09K 11/06* | (2006.01) |
| *H10K 50/11* | (2023.01) |
| *H10K 50/12* | (2023.01) |
| *H10K 50/13* | (2023.01) |
| *H10K 85/60* | (2023.01) |
| *H10K 101/00* | (2023.01) |
| *H10K 101/10* | (2023.01) |
| *H10K 101/20* | (2023.01) |
| *H10K 102/00* | (2023.01) |

(52) U.S. Cl.
CPC .............. *C09K 11/06* (2013.01); *H10K 50/11* (2023.02); *H10K 50/12* (2023.02); *H10K 50/13* (2023.02); *H10K 85/658* (2023.02); *H10K 2101/10* (2023.02); *H10K 2101/20* (2023.02); *H10K 2101/90* (2023.02); *H10K 2102/361* (2023.02)

(58) Field of Classification Search
CPC ........ H10K 2101/27; H01L 2251/5376; H01L 2251/5384
See application file for complete search history.

(56) References Cited

U.S. PATENT DOCUMENTS

| | | |
|---|---|---|
| 8,847,218 B2 | 9/2014 | Nishimura et al. |
| 8,963,127 B2 | 2/2015 | Pieh et al. |
| (Continued) | | |

FOREIGN PATENT DOCUMENTS

| | | |
|---|---|---|
| CN | 102074656 A | 5/2011 |
| CN | 110034234 A | 7/2019 |
| (Continued) | | |

*Primary Examiner* — Evren Seven
(74) *Attorney, Agent, or Firm* — Seed Intellectual Property Law Group LLP

(57) ABSTRACT

Disclosed are an organic light emitting device and a display device using the same in which a light emitting layer includes a host and a plurality of dopants. In the light emitting layer, energy is transferred from a host and other dopants to one dopant by energy transfer system, thus it is possible to increase luminous efficacy of a single color and to increase lifetime of emission.

14 Claims, 29 Drawing Sheets

(56) References Cited

U.S. PATENT DOCUMENTS

| | | |
|---|---|---|
| 10,418,573 B2 | 9/2019 | Kim et al. |
| 2010/0295444 A1 | 11/2010 | Kuma et al. |
| 2014/0034927 A1* | 2/2014 | Seo .................. H10K 50/11 |
| | | 257/40 |
| 2019/0040314 A1 | 2/2019 | Ito et al. |
| 2021/0098714 A1 | 4/2021 | Choi et al. |

FOREIGN PATENT DOCUMENTS

| | | |
|---|---|---|
| CN | 110034243 A | 7/2019 |
| CN | 110335951 A | 10/2019 |
| KR | 20120029397 A | 3/2012 |
| KR | 10-2015-0085661 A | 7/2015 |
| KR | 10-2016-0101519 A | 8/2016 |
| KR | 101680934 B1 | 11/2016 |
| KR | 20180078637 A | 7/2018 |
| KR | 20180105234 A | 9/2018 |
| KR | 10-2021-0039516 A | 4/2021 |

\* cited by examiner

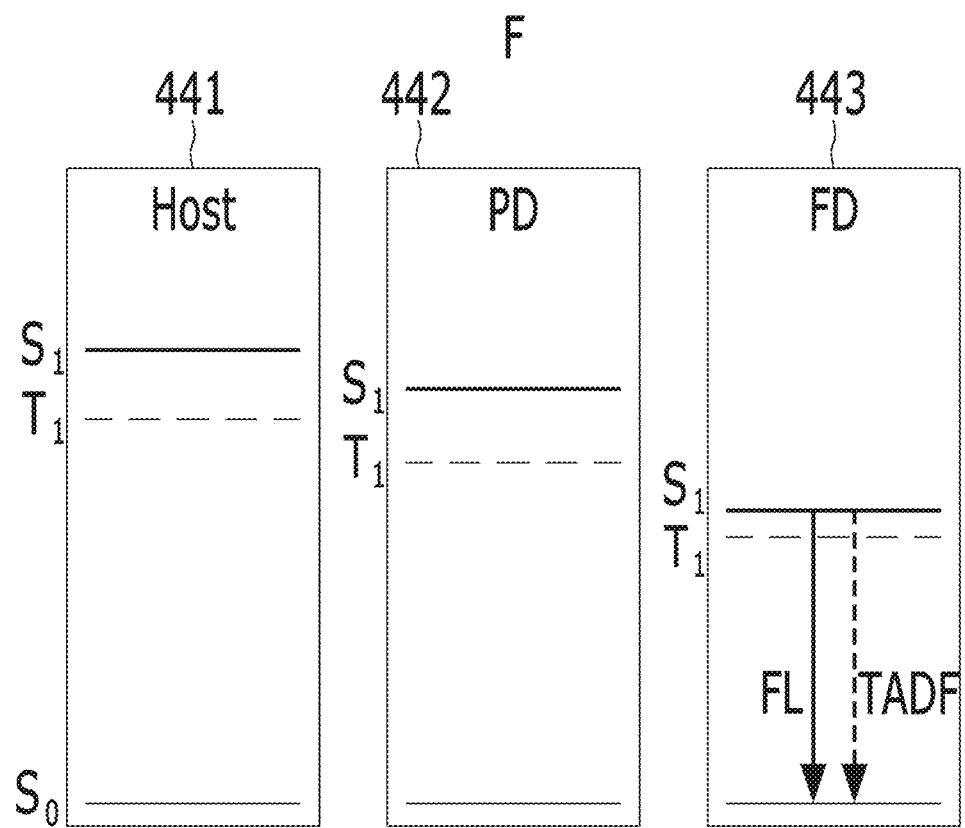

ORGANIC LIGHT EMITTING DEVICE AND DISPLAY DEVICE USING THE SAME

CROSS-REFERENCE TO RELATED APPLICATION(S)

This application is a continuation of U.S. patent application Ser. No. 17/096,616, filed May 20, 2021, which claims the benefit of Korean Patent Application No. 10-2019-0147065, filed on Nov. 15, 2019, which is hereby incorporated by reference as if fully set forth herein.

BACKGROUND

Technical Field

The present disclosure relates to a light emitting device, and more particularly, to an organic light emitting device, which includes different kinds of dopants in at least one light emitting layer, and secures the luminescence property of a color and achieves lifespan improvement by transferring energy to one of the different kinds of dopants, and a display device using the same.

Description of the Related Art

As society has recently entered the information age, the field of displays for visually displaying electrical information signals has rapidly developed and, in order to satisfy such development, various flat display devices having excellent performance, such as slimness, light weight and low power consumption, have been developed and have rapidly replaced conventional cathode ray tubes (CRTs).

As examples of such flat display devices, there are a liquid crystal display (LCD) device, a plasma display panel (PDP) device, a field emission display (FED) device, an organic light emitting diode (OLED) display device, a quantum dot display device, etc.

Thereamong, an organic light emitting diode (OLED) display device, which does not require a separate light source and achieves compactness and clear color display, is considered as a competitive application.

In the organic light emitting diode (OLED) display device, a plurality of subpixels is provided, and an organic light emitting diode including a light emitting layer between electrodes opposite each other is arranged in each subpixel. Further, the organic light emitting diode in the subpixel emits light due to formation of an electric field between the electrodes, thus exhibiting a display function.

Such a light emitting layer includes a host as a main ingredient, and further includes a dopant which may determine a color of emitted light. Further, dopants are divided into fluorescent dopants and phosphorescent dopants according to luminescence methods. Properties of the fluorescent dopants and phosphorescent dopants are different according to colors of emitted light, and particularly, in case of a blue light emitting layer, none of the well-known fluorescent dopants and phosphorescent dopants is capable of exhibiting excellent properties in terms of lifespan and efficiency.

BRIEF SUMMARY

The inventors of the present disclosure have realized that there is a difficulty in composing a material for a blue light emitting layer that satisfies both an improved lifespan and color efficiency as compared to other colored light emitting layers. Accordingly, because the blue light emitting layer has relatively low efficiency and reduced lifespan and these changes become conspicuous over time, among different colored light emitting layers, the inventors have developed a material for the blue light emitting layer which may satisfy both efficiency and lifespan. One or more embodiments of the present disclosure provides an organic light emitting display device which may achieve full color display in the overall visible range that also satisfies both efficiency and lifespan in all colors.

Additionally, the present disclosure is directed to an organic light emitting device and a display device using the same that substantially obviate one or more problems due to limitations and disadvantages of the related art.

One or more embodiments of the present disclosure provides an organic light emitting device, which includes different kinds of dopants in one light emitting layer, and secures the luminescence property of a single color and achieves lifespan improvement by transferring energy to one of the different kinds of dopants, and a display device using the same.

Further embodiments of the present disclosure provides an organic light emitting device, which includes different kinds of dopants in one light emitting layer, and secures the luminescence property of a single color and achieves lifespan improvement by transferring energy to one of the different kinds of dopants and a display device using the same. Herein, the dopant to which energy is transferred is a dopant capable of a thermally activated delayed fluorescence.

Additional advantages, technical benefits, and features will be set forth in part in the description which follows and in part will become apparent to those having ordinary skill in the art upon examination of the following or may be learned from the disclosure. Other advantages of the present disclosure may be realized and attained by the structure particularly pointed out in the written description and claims hereof as well as the appended drawings.

To achieve these and other advantages and in accordance with the one or more embodiments of the present disclosure, as embodied and broadly described herein, an organic light emitting device according to one embodiment of the present disclosure may comprise a light emitting layer provided between a first electrode and a second electrode arranged opposite each other. The light emitting layer may comprise at least one host, a first dopant to which energy is transferred from the host and a second dopant to which energy is transferred from the host and the first dopant. A thermally activated delayed fluorescence (TADF) may be generated through a reverse intersystem crossing transfer from the triplet excited state to the singlet excited state in the second dopant.

Further, a display device according to the present disclosure in order to achieve the similar technical benefits may comprise a substrate comprising a plurality of subpixels, a thin film transistor in each of the subpixels, and an organic light emitting device in each of the subpixels connected to the thin film transistor. The organic light emitting device may comprise a first electrode and a second electrode arranged opposite each other, and at least one light emitting layer between the first and second electrodes. The at least one light emitting layer may comprise the at least one host, the first dopant to which energy is transferred from the host and the second dopant to which energy is transferred from the host and the first dopant.

The display device may comprise a plurality of stacks divided by a charge generation layer therebetween, and each of the stacks includes at least one common layer. The at least one light emitting layer may be in at least one stack among the plurality of stacks.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIGS. 11A and 11B are views illustrating energy transfer relationships in modified embodiments of FIG. 10.

DETAILED DESCRIPTION

Figure 1:
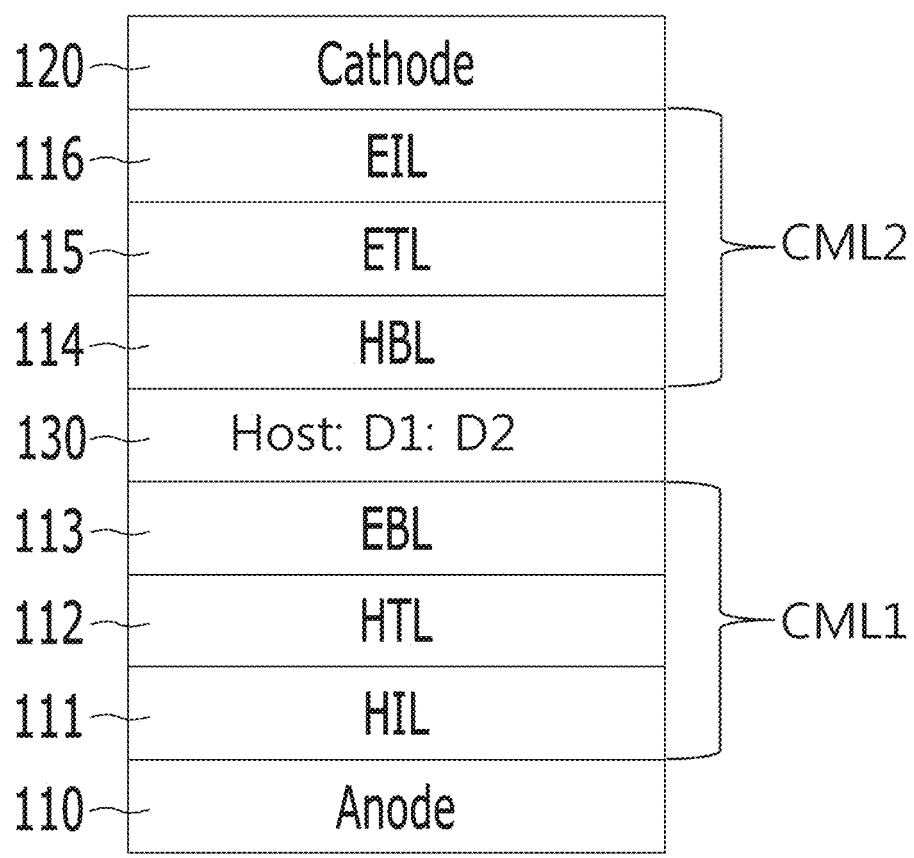
FIG. 1 is a cross-sectional view illustrating an organic light emitting device according to the present disclosure.

Reference will now be made in detail to one or more embodiments of the present disclosure, examples of which are illustrated in the accompanying drawings. In the following description of the embodiments and the drawings, the same or similar elements are denoted by the same reference numerals throughout the specification. In the following description of the embodiments of the present disclosure, a detailed description of known functions and configurations incorporated herein will be omitted when it may make the subject matter of the present disclosure rather unclear. Further, the names of elements used in the following description of the embodiments of the present disclosure are selected in consideration of ease of preparation of the specification, and may thus differ from the names of parts of an actual product.

The shapes, sizes, ratios, angles and numbers of elements given in the drawings to describe the embodiments of the present disclosure are merely for examples, and thus, the present disclosure is not limited to the illustrated details. In the following description of the embodiments, the terms "including," "comprising," and "having" are to be interpreted as indicating the presence of one or more other characteristics, numbers, steps, operations, elements or parts stated in the specification or combinations thereof, and do not exclude the presence of other characteristics, numbers, steps, operations, elements, parts or combinations thereof, or the possibility of adding the same, unless the term "only" is used. It will be understood that a singular expression of an element(s) encompasses a plural expression unless the context clearly indicates otherwise.

In interpretation of elements included in the various embodiments of the present disclosure, it is to be interpreted that the elements include error ranges unless stated otherwise.

In the following description of the embodiments of the present disclosure, it will be understood that, when positional relationships are expressed, for example, when an element is said to be "on," "above," "under" or "beside" another element, the two elements may directly contact each other, or one or more other elements may be interposed between the two elements, unless the term "just" or "directly" is used.

In the following description of the embodiments of the present disclosure, it will be understood that, when temporal relationships are expressed, for example, when terms expressing a sequence of events, such as "after," "subsequent to," "next," and "before" are used, the terms encompass both a continuous relationship between the events and a discontinuous relationship between the events, unless the term "just" or "directly" is used.

In the following description of the embodiments of the present disclosure, it will be understood that, when the terms "first," "second," etc. are used to describe various elements, these terms are used merely to distinguish the same or similar elements. Therefore, a first element described hereinafter could be termed a second element without departing from the technical scope of the disclosure.

Respective features of the various embodiments of the present disclosure may be partially or wholly coupled to or combined with each other and be interlocked or driven in various technical manners, and the respective embodiments may be implemented independently of each other or be implemented together through connection therebetween.

In the following description of the embodiments, the terms "Lowest Unoccupied Molecular Orbital (LUMO) energy level" and "Highest Occupied Molecular Orbital (HOMO) energy level" of a layer mean a LUMO energy level and a HOMO energy level of a material occupying the majority of the weight of the corresponding layer, for example, a host material, unless they refer to the LUMO energy level and the HOMO energy level of a dopant material with which the corresponding layer is doped.

In the following description of the embodiments, it will be understood that the term "HOMO energy level" means an energy level measured through cyclic voltammetry (CV) in which an energy level is determined from a potential value relative to that of a reference electrode having a known electrode potential value. For example, the HOMO energy level of any material may be measured using ferrocene having a known oxidation potential value and reduction potential value, as a reference electrode.

In the following description of the embodiments, the term "doped" means that less than 50 wt % of the content of a material having properties different from a material occupying the majority of the weight of a corresponding layer (materials having different properties being, for example, N-type and P-type materials, or an organic material and an inorganic material) is added to the material occupying the majority of the weight of the corresponding layer. In other words, a "doped" layer means a layer in which a host material and a dopant material may be distinguished from each other based on the ratio of the weight percentages thereof. In addition, the term "undoped" means all cases other than the case corresponding to the term "doped." For example, if a layer is formed of a single material or is formed of a mixture of materials having the same or similar properties, the layer may be an "undoped" layer. For example, if some of materials forming a layer are P-type (or N-type) and all of the materials forming the layer are not P-type (or N-type), the layer may be regarded as a layer "doped with" the P-type materials. For example, if some of materials forming a layer are small amounts of inorganic materials and the remainder of the materials forming the layer, e.g., main materials, are organic materials, the layer may be regarded as a layer "doped with" with the inorganic materials.

In the following description of the embodiments, an electroluminescence (EL) spectrum is calculated by multiplying (1) a photoluminescence (PL) spectrum, in which the intrinsic properties of a light emitting material, such as a dopant material or a host material included in an organic light emitting layer, are reflected, by (2) an out-coupling emittance spectrum curve which is determined by the structure and optical properties of an organic light emitting element including the thickness of organic layers, such as a hole transport layer and an electron transport layer.

Hereinafter, an organic light emitting device and a display device using the same according to the present disclosure will be described with reference to the accompanying drawings.

Figure 2:
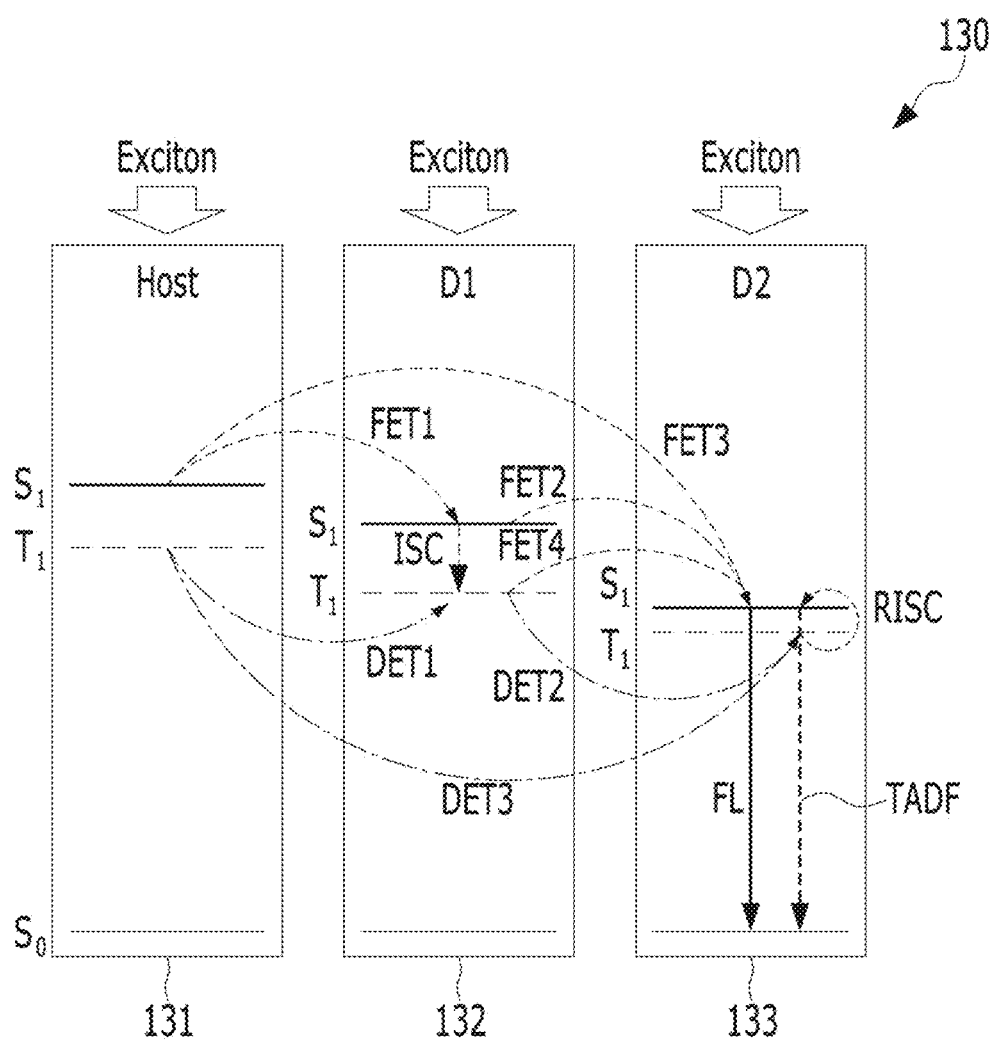
FIG. 2 is a view illustrating energy transfer relationships in a light emitting layer of FIG. 1.
Figure 3:
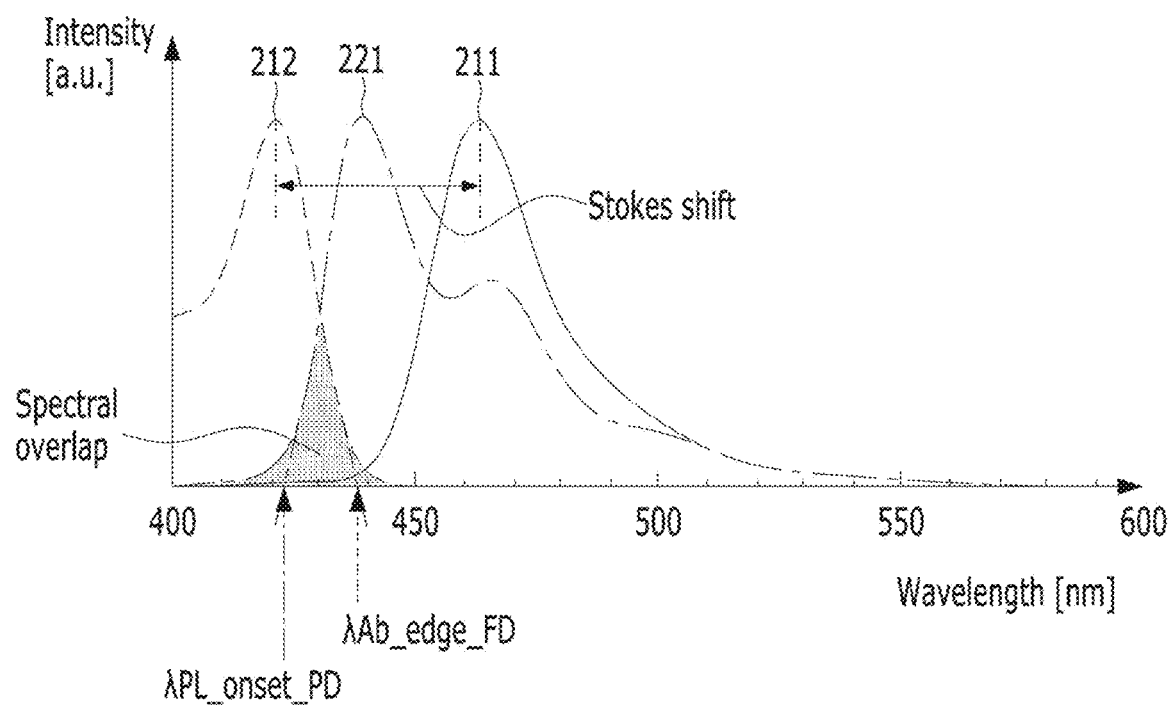
FIG. 3 is a graph showing the PL spectrum of a first dopant and the PL spectrum and absorption spectrum of a second dopant in the light emitting layer of FIG. 1.

FIG. 1 is a cross-sectional view illustrating an organic light emitting device according to the present disclosure, FIG. 2 is a view illustrating energy transfer relationships in a light emitting layer of FIG. 1 and FIG. 3 is a graph showing the PL spectrum of a first dopant and the PL spectrum and absorption spectrum of a second dopant in the light emitting layer of FIG. 1.

As shown in FIG. 1, the organic light emitting device according to the present disclosure includes a light emitting layer 130 provided between a first electrode 110 and a second electrode 120 arranged opposite each other.

At least one first common layer CML1 relating to hole transport may be provided between the first electrode 110 and the light emitting layer 130, and/or at least one second common layer CML2 relating to electron transport may be provided between the light emitting layer 130 and the second electrode 120.

Herein, the first common layer CML1 and the second common layer CML2 are in contact with the light emitting layer 130, respectively. Main material constituting the first or second common layer CML1, CLM2 has a triplet excited state having an energy level higher than or equal to a triplet excited state of a host in the light emitting layer 130. So excitons (singlets or triplets) entering the light emitting layer 130 from the electrodes 110 or 120 through the first or second common layers CML1 or CML2 may be confined in the light emitting layer 130 and can be used for light emission.

As shown in FIGS. 1 and 2, the light emitting layer 130 includes a host Host, a first dopant D1 to which energy is transferred from the host and a second dopant D2 to which energy is transferred from the host and the first dopant. Herein, a thermally activated delayed fluorescence (TADF) is generated through a reverse intersystem crossing (RISC) transfer from the triplet excited state to the singlet excited state in the second dopant D2.

In the light emitting layer 130 of the organic light emitting device, formation of excitons by charge recombination may occur in the host Host, the first dopant D1 and the second dopant D2, respectively. Singlet excitons generated at the host Host are transferred into singlet exited states of the first and second dopants D1 and D2 through Forster energy transfer FET1 and FET3. Triplet excitons generated at the host Host are transferred into triplet exited states of the first and second dopants D1 and D2 through Dexter energy transfer DET1 and DET3. Triplet excitons generated at the first dopant D1 is transferred to the singlet excited state of the second dopant D2 which is a fluorescent dopant, through Forster energy transfer FET4 and thus fluorescence is emitted from the second dopant D2. Also, the triplet excitons generated at the second dopant D2 is transferred to the singlet excited state of the second dopant D2 through Reverse Intersystem Crossing (RISC) transfer, thus thermally activated delayed fluorescence (TADF) is generated at the second dopant D2. Therefore, the second dopant D2 theoretically has internal quantum efficiency of 100%.

The light emitting layer 130 includes the host Host as a main material in an amount of 50 wt % or more. The host Host controls carriers, such as holes and electrons injected from the adjacent first electrode 110 and second electrode 120, and transfers energies from the singlet excited state and triplet excited state of excitons which are generated by recombination of holes and electrons into first and second dopants D1 and D2.

In the host Host, excitons generated in itself do not directly function to emit. Rather the Photoluminescence (PL) spectrum of the host Host overlaps with Absorption spectrums of the first and second dopants D1 and D2, so that energies from the host Host are transferred to the first and second dopants D1 and D2. The energy transfer of the first and second dopants D1 and D2 to the triplet excited state T1 is called "Dexter Energy Transfer (DET)," and the energy transfer of the first and second dopants D1 and d2 to the single excited state S1 is called "Forster energy transfer (FET)." The first Forster energy transfer FET1 is generated from the singlet excited state of the host Host to the singlet excited state of the first dopant D1, and the first Dexter energy transfer DET1 is generated from the triplet excited state of the host Host to the triplet excited state of the first dopant D1. For facilitating such energy transfers, the singlet excited state S1 of host Host is higher than or equal to the singlet excited state S1 of the first dopant D1, and the triplet excited state T1 of host Host is higher than or equal to the triplet excited state T1 of the first dopant D1.

Herein, energy levels of the singlet excited state S1 and triplet excited state T1 are compared to a ground state S0. Thus the high energy level means that excited state is far from the ground state S0. On the contrary, the low energy level means that the excited state is close to the ground state S0.

As shown in FIG. 2, each of the singlet excited states S1 of the host Host, and the first and second dopants D1 and D2 is higher than each of the triplet excited states T1 of the host Host, and the first and second dopants D1 and D2.

Also, FIG. 2 shows the singlet excited state S1 and the triplet excited state T1 of the dopant D1. The second Forster energy transfer FET2 is generated from the singlet excited state of the first dopant D1 to the singlet excited state of the second dopant D2, and the second Dexter energy transfer DET2 is generated from the triplet excited state of the first dopant D1 to the triplet excited state of the second dopant D2.

The energy transfers FET 1 and DET 1 from the host Host to the first dopant D1, as well as a direct energy transfer from the host Host to the second dopant D2 is generated. That is, the third Forster energy transfer FET3 is generated from the singlet excited state of the host Host to the singlet excited state of the second dopant D2, and the third Dexter energy transfer DET3 is generated from the triplet excited state of the host Host to the triplet excited state of the second dopant D2. That is, the second dopant D2 receives energy from the host Host and the first dopant D1.

Also, the first to third Forster energy transfers FET1 to FET3 and the first to third Dexter energy transfer DET1 to DET3 are facilitated since a giving side is in a higher energy level state than that of the receiving side.

In the light emitting layer 130 of the organic emitting device, as shown in FIG. 3, the first dopant D1 is a phosphorescence dopant and the second dopant D2 is a fluorescence dopant. At a spectral overlap between the PL spectrum 221 of the first dopant D1 and the absorption spectrum 212 of the second dopant D2, the energy transfer from the first dopant D1 to the second dopant D2 is generated. At the spectral overlap between the PL spectrum 221 of the first dopant D1 and the absorption spectrum 212 of the second dopant D2 is bigger, the energy transfer is effectively performed. In this energy transfer process, as the spectral overlap between the PL spectrum 221 of the first dopant D1 and the absorption spectrum 212 of the second dopant D2 is bigger, in particular, the second Forster energy transfer FET2 and a Förster energy transfer FET4 are effectively generated. Since the Förster energy transfer is made by an energy transfer process of long distance (<10 nm) under the dipole-dipole exchange interaction, the Förster energy transfer is effectively generated when an energy transfer length due to the spectral overlap between the PL spectrum 221 of the first dopant D1 and the absorption spectrum 212 of the second dopant D2 becomes long. On the contrary, since the Dexter energy transfer DET is possible when orbitals of heterogeneous dopants D1 and D2 are physically overlaps, an energy transfer length of the Dexter energy transfer DET is very short, at the level of 1 nm or less.

In the light emitting layer 130 of the organic light emitting device of the present disclosure, in order to improve fluorescence emission effect in the second dopant D2, doping concentrations of the first and second dopants D1 and D2 are adjusted so that the Forster energy transfer FET is bigger than the Dexter energy transfer DET. That is, a concentration of the first dopant D1 is greater than a concentration of the second dopant D2. The doping concentration of the first dopant D1 is 1 wt % to 40 wt % and the doping concentration of the second dopant D2 is 0.01 wt % to 10 wt %, and then a distance between the first and second dopant D1 and D2 may be adjusted so that the Forster energy transfer FET is easily possible, whereas the Dexter energy transfer DET may occur easily. In addition, since the doping concentration of the second dopant D2 is set to be small in the light emitting layer 130, recombination at the triplet state T1 in the second dopant D2 is hardly performed, triplets directly generated at the second dopant D2 can be limited and efficiency of forming singlets in the singlet excited state S1 is increased as much as possible.

Meanwhile, the fourth Forster energy transfer FET4 may be generated from the triplet excited state T1 of the first dopant D1 to the singlet excite state S1 of the second dopant D2. As the spectral overlap between the PL spectrum 212 of the first dopant D1 and the absorption spectrum 212 of the second dopant D2 is greater, the fourth Forster energy transfer FET4 is more generated in the light emitting layer 130 and a luminous efficiency of the second dopant D2 can be increased since amount of fluorescence emission is greater.

And, in the second dopant D2, a reverse Intersystem Crossing RICS transfer can be generated due to the minute energy level difference $\Delta E_{st}$ between the singlet excited state S1 and the triplet excited state T1. So in the second dopant D2, the energy transferred to the triplet excited state T1 through the second and third Dexter energy transfers DET2 and DET3 is again transferred to the singlet excited state S1 through the RICS transfer. At this time, the energy generated by the RICS transfer can be used for Thermally Activated Delayed Fluorescence TADF. Compared to the TADF, the transferred energy to the singlet excited state S1 of the second dopant D2 through the second and third Forster energy transfers FET2 and FET3 from the host Host and the first dopant D1 can be used in the fluorescence emission FL. Here, it is preferable that a difference between the triplet energy level $T_1$ and the singlet energy level $S_1$ is 0.4 eV or less in the second dopant D2. In the second dopant D2, there must be the difference in energy level between the singlet excited state S1 and the triplet excited state T1, and may be approximately 0.01 eV or more.

That is, in the light emitting layer 130 of the organic light emitting device of the present disclosure, the fluorescence emission FL and the thermally activated delayed Fluorescence TADF at the second dopant D2 are generated together, thus the same second dopant D2 emits light with fluorescence characteristics, thereby it is possible to have an increased color emission characteristics of unicolor.

Fluorescence FL by the Forster energy transfer FET emits immediately in nanoseconds, and the thermally activated delayed fluorescence TADF is delayed in microseconds to emit light. But there is no difference in perception of the human eyes between the Fluorescence FL and the TADF.

Referring FIG. 2, at the first dopant D1, an energy transfer from the single excited state S1 to the triplet excited state T1 is partially generated through intersystem Crossing ISC transfer. However, the transferred energy through the ISC transfer and the first DET1 to the triplet excited state T1 of the first dopant D1 is again partially transferred to the triplet excited state T1 of the second dopant D2, and then transferred to the singlet excited state S1 of the second dopant D2 through the RISC transfer and the transferred energy to the singlet excited state S1 of the second dopant D2 is finally used in the thermally activated delayed fluorescence TADF. In the light emitting layer 130 of the present disclosure, since there is a difference of doping concentration between the first and second dopants D1 and D2, the Dexter energy transfer DET between the first and second dopant D1 and D2 is minimized, the Forster energy transfer FET is maximized. And a recombination rate is minimized at the second dopant D2, thus generating triplets are suppressed and occurrence of singlets are induced at the second dopant D2, so that a duration of the triplets is reduced. Therefore, it is possible to prevent phenomena such as triplet-triplet annihilation (TTA) and triplet-polaron annihilation (TPA) and to improve emission life of the light emitting layer 130. That is, the present disclosure realizes a long lifespan and stability of the organic light emitting device.

Also, the transferred energies to the triplet excited state T1 of the second dopant D2 through the Dexter energy transfers DET2 and DET3 can be fully used in TADF, and thus an internal quantum efficiency of 100% is theoretically possible.

In the light emitting layer 130 of the present disclosure, the second dopant D2 may be fluorescent dopant capable of TADF, and the first dopant D1 may be phosphorescent dopant. In some cases, the first dopant D1 may not be a phosphorescent dopant. If the first dopant D1 can smoothly transfer energy to the second dopant D2, it may be selected as a non-phosphorescent dopant.

The first dopant D1 uses, for example, a metal complex compound including, as a core, iridium (Ir), platinum (Pt), osmium (Os), gold (Au), titanium (Ti), zirconium (Zr), hafnium (Hf), europium (Eu), terbium (Tb), palladium (Pd) or thulium (Tm).

The second dopant D2 may be a boron-based compounds, for example, shown in the following Chemical Formulas 1 to 9, or modified examples thereof.

[Chemical Formula 1]

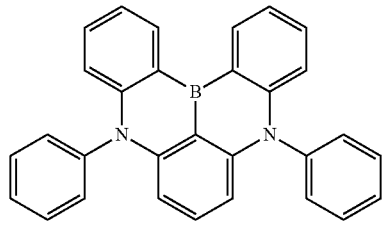

[Chemical Formula 2]

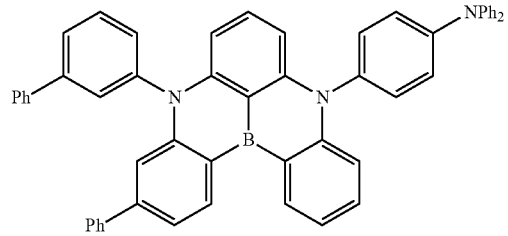

[Chemical Formula 3]

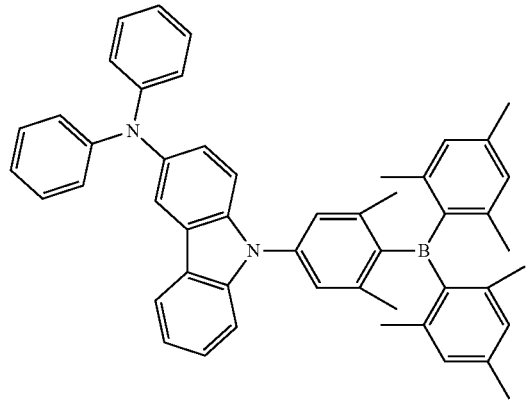

[Chemical Formula 4]

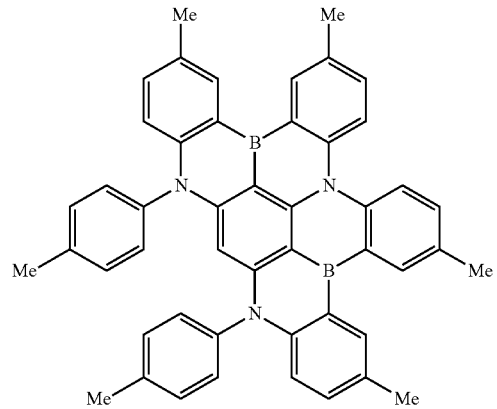

[Chemical Formula 5]

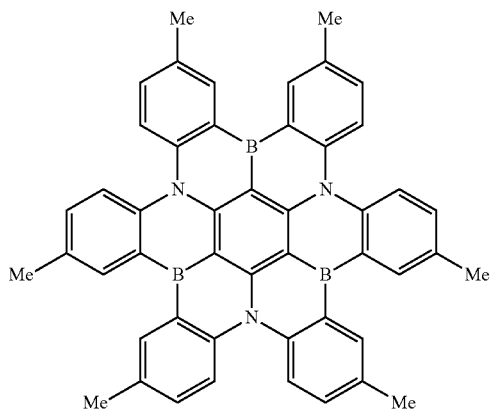

[Chemical Formula 6]

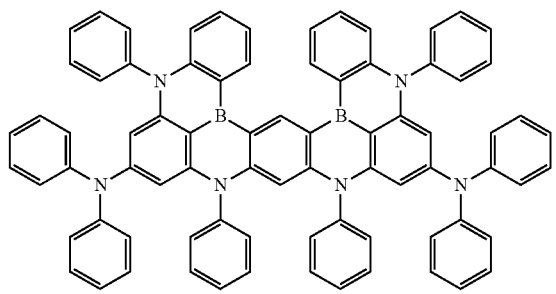

[Chemical Formula 7]

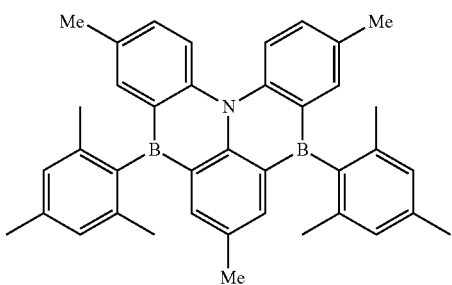

[Chemical Formula 8]

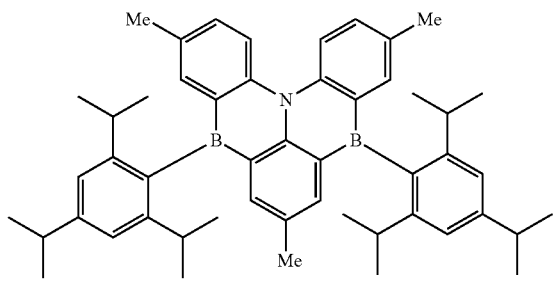

[Chemical Formula 9]

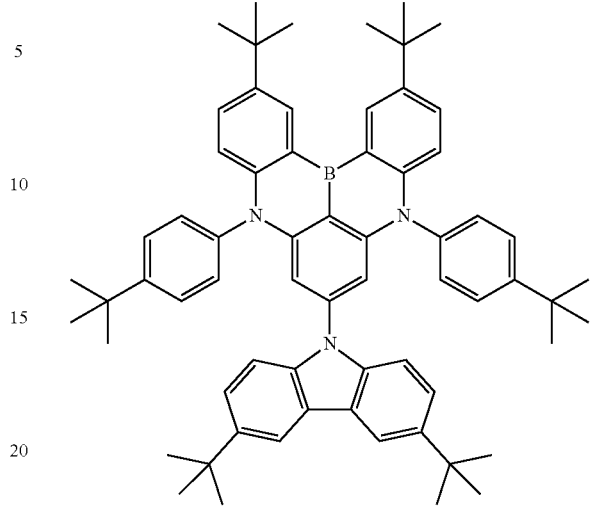

In the light emitting layer of the organic light emitting device according to the present disclosure, the first dopant D1 does not directly emit light and transfers energy received from the host and its own excitation energy to the second dopant D2, and in order to realize the maximum efficiency of the light emitting layer, it is desirable for the first dopant D1 not to emit light or to emit almost no amount of light.

In test examples which will be described below, a phosphorescent dopant was used for the first dopant D1 and a fluorescent dopant was used for the second dopant D2. An iridium complex compound or a platinum complex compound is used as the phosphorescent dopant PD and a boron-based compound was used as the fluorescent dopant FD. In this case, it was confirmed that the phosphorescent dopant PD effectively transfers energy received from the host and its own excitation energy to the triplet excited state of the fluorescent dopant, and the fluorescent dopant FD formed of the boron-based compound simultaneously generates both fluorescence of a single color and thermally activated delayed fluorescence (TADF), as shown in FIG. 2, and thereamong, fluorescence of the unicolor mainly occurs.

In the light emitting layer of the organic light emitting device according to the present disclosure, in comparison between the intrinsic PL spectrum of the phosphorescent dopant PD and the intrinsic PL spectrum of the fluorescent dopant FD, as shown in FIG. 3, the fluorescent dopant FD may have a narrow full width at half maximum (FWHM). In the organic light emitting device according to the present disclosure, light emission is concentrated upon the fluorescent dopant FD, and thus, light emission is realized based on fluorescence characteristics having the narrow full width at half maximum (FWHM) depending on the properties of the fluorescent dopant FD, and this means that high color purity in light emission may be realized.

Meanwhile, in the organic light emitting device of the present disclosure, due to a small stokes shift characteristics of the second dopant D2, the energy level of the triplet excited state T1 of the first dopant D1 provided for the fourth Förster energy transfer FET4 in the light emitting layer 130 can be set to a value similar to the singlet excited state S1 of the second dopant D2. Also, for example, when the full width at half maximum (FWHM) based on the same color coordinate is small, the energy of excited state decreases compared to when the FWHM based on the same color coordinate is long. In other words, required triplet excited state T1 of the first dopant D1 as the phosphorescent dopant can be lowered similar to the singlet excited state S1 of the second dopant D2. Since the triplet excited state T1 of the first dopant D1 of the present disclosure is not higher compared to a general phosphorescent light emitting device that applies a single phosphorescent dopant with a wide FWHM, so a material having a low triplet excited state T1 can be selected as the first dopant D1 which is the phosphorescent dopant, and thus the material stability of the first dopant D1 is realized, and a range of material selection for the first dopant can be widened. As a result, it is possible to improve stability of the organic light emitting device. In particular, even for the blue light emitting device, the light emitting layer 130 uses the first dopant (phosphorescent dopant) having a low triplet excited state and so that a unicolor can be stably implemented.

Meanwhile, a total amount of the first and second dopants D1 and D2 is 50 wt % or less in the light emitting layer. The first dopant D1 which gives energy has a concentration of 1 wt % to 40 wt % and the second dopant D2 which receives energy has a concentration of 0.01 wt % to 10 wt %. The concentration of the second dopant D2 is smaller than the concentration of the first dopant D1 in the light emitting layer 130. But since, by the Forster energy transfer FET and the Dexter energy transfer DET, energies are transferred to the second dopant D2 and the second dopant D2 emits light with an internal quantum efficiency of 100% even at a small concentration, thus the light emitting layer including the host Host and the first and second dopants D1 and D2 has sufficient light emission efficiency.

In the light emitting layer of the present disclosure, since the first dopant D1 transfers energy to the second dopant D2, self-phosphorescence is hardly generated or insignificant, compared to the fluorescence FL and the thermally activated delayed fluorescence TADF at the second dopant D2.

The first dopant D1 may be a phosphorescence dopant and the second dopant D2 may be a fluorescent dopant. When energy is released from the singlet excited state S1 to the ground state S0 in the second dopant D2 of the light emitting layer 130, the fluorescence FL and the thermally activated delayed fluorescence (TADF) at the second dopant can be together generated. In this case, since fluorescence is generated at the second dopant by transferring energy from the first dopant D1 of phosphorescent dopant, it is also referred to as Phosphorescence-Sensed Fluorescence PSF emission.

An amount of Forster energy transfer (FET2+FET3+FET4) may be bigger than an amount of energy transfer (DET2+DET3) in the energy transfer from the first dopant D1 to the second dopant D2.

The reverse intersystem crossing (RISC) transfer from the triplet excited state to the singlet excited state in the second dopant D2 may be proportional to a Dexter energy (DET2+DET3) from the host Host and the first dopant D1 to the second dopant D2, and an energy of triplet excitons generated in the second dopant D2.

As shown in FIG. 3, the absorption spectrum 212 of the second dopant D2 and the PL spectrum 221 of the first dopant D1 in the light emitting layer 130 spectrally overlaps each other in a wavelength range of 10 nm or more. The maximum wavelength of the absorption spectrum 212 of the second dopant D2 is greater than the minimum wavelength of the PL spectrum 221 of the first dopant D1, and thus the absorption spectrum 212 of the second dopant D2 overlaps with the PL spectrum 221 of the first dopant D1. By such spectral overlap, the Forster energy transfer FET from the triplet excited state T1 of the first dopant D1 to the singlet excited state S1 of the second dopant D2 is possible.

In the light emitting layer 130 of the organic light emitting device of the present disclosure, the peak wavelength of the absorption spectrum 212 of the second dopant D2 which receives the energy is positioned at a shorter wavelength than the peak wavelength of the PL spectrum 221 of the first dopant D1 which gives the energy. This means that the PL spectrum 221 of first dopant D1 is positioned between the absorption spectrum 212 of the second dopant D2 and the PL spectrum 211 of the second dopant D2, thus it is possible to facilitate the Spectral Overlap between the absorption spectrum 212 of the second dopant D2 and the PL spectrum 221 of the first dopant D1. For this, the area of the Spectral Overlap should be over a certain level. To determine the area of the Spectral Overlap (Integral value) between the absorption spectrum 212 of the second dopant D2 and the PL spectrum 221 of the first dopant D1, there are meaning in a distance between a first wavelength $\lambda$ab_edge_FD which meets a main slope on a longer wavelength side of the absorption spectrum 212 of the second dopant D2 and a second wavelength $\lambda$PL_onset_FD which meets a main slope on a shorter wavelength side of the PL spectrum 221 of the first dopant D1, and a height of the Spectral Overlap the absorption spectrum 212 of the second dopant D2.

Meanwhile, "Stokes Shift" means a difference between a wavelength representing a peak of the absorption spectrum 212 of the second dopant D2 and a wavelength representing a peak of the PL spectrum 211 of the second dopant D2. A Value of the Stokes Shift varies depending on the properties of the second dopant D2. In particular, as the value of the Stokes Shift is smaller, the full width at half maximum FWHM tends to be smaller.

As shown in FIG. 3, an emitting peak wavelength of the PL spectrum 221 of first dopant D1 may be positioned between the peak wavelength of the absorption spectrum 212 of the second dopant D2 and the emitting peak of the PL spectrum 211 of the second dopant D2. And the PL spectrum 221 of the first dopant D1 may have the Spectral Overlap at the overlapping region with the absorption spectrum 212 of the second dopant D2.

The difference in the emission peaks between the PL spectrum 221 of the first dopant D1 and the PL spectrum 211 of the second dopant D2 may be within 30 nm, so uniformity of light emission among the first and second dopants D1 and D2 can be maintained, even though the first dopant D1 emits in a small amount in a process of the energy transfer from the first dopant D1 to the second dopant D1.

Meanwhile, FIG. 3 shows that the PL spectrum 221 of the first dopant D1 and the second PL spectrum 211 of the second dopant D2 represent blue emission. However, the present disclosure is not limited thereto. In the following embodiments, first and second dopants representing different color emissions will be described.

Firstly, a first experimental example of a phosphor-sensitized fluorescence PSF method will be described. In the first experimental example, the light emitting layer includes a host, a fluorescent dopant and phosphorescent dopant in an emitting layer. Since the fluorescent dopant emits a different color from an emission color of the phosphorescent dopant (there is a big difference in wavelengths between the fluorescent dopant and the phosphorescent dopant) and the fluorescent dopant does not have TADF (thermally-activated delayed fluorescence) properties in the first experimental example, first experimental example represents different characteristics from the embodiment according to FIG. 3.

Figure 4A:
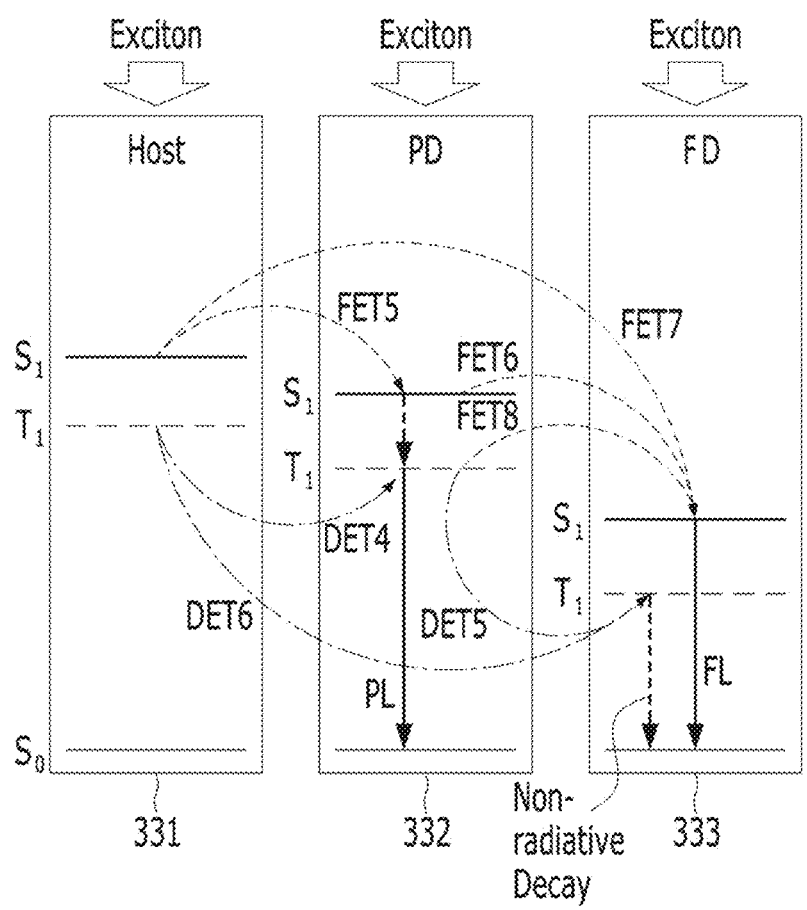
FIG. 4A is a view illustrating energy transfer relationships in a light emitting layer according to a first experimental example.
Figure 4B:
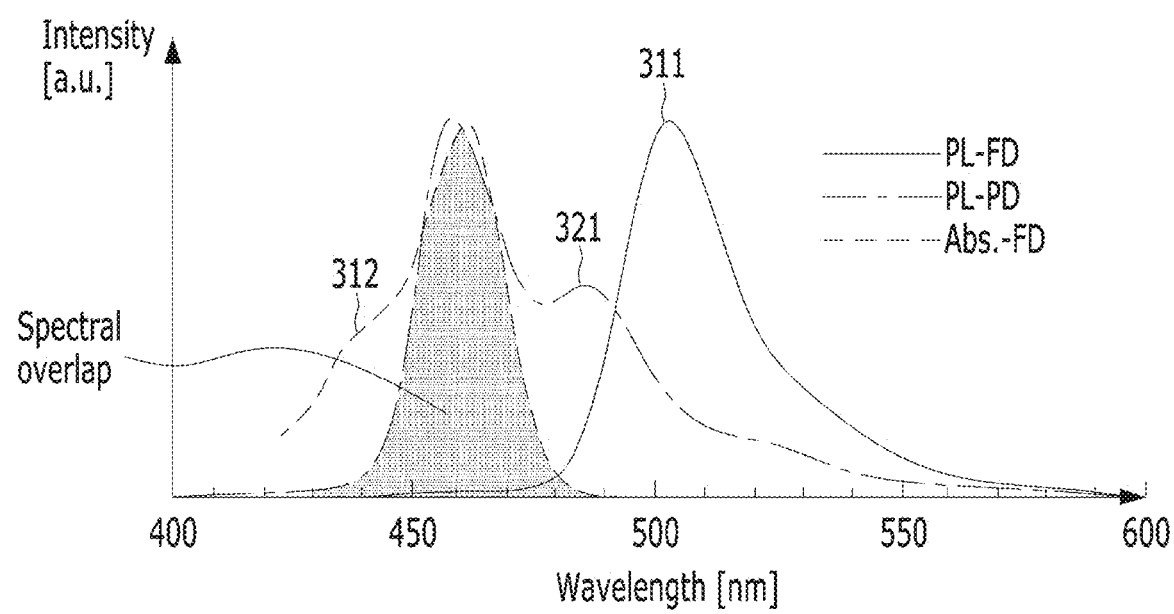
FIG. 4B is a graph showing the PL spectrums of different dopants according to a first experimental example.

FIG. 4A is a view illustrating energy transfer relationships in a light emitting layer according to a first experimental example and FIG. 4B is a graph showing the PL spectrums of different dopants according to a first experimental example.

As shown in FIG. 4A, in a light emitting layer according to the first experimental example, energies are transferred, from the host Host to the phosphorescent dopant PD and the fluorescent dopant FD, and from the phosphorescent dopant PD to the fluorescent dopant FD, respectively.

That is, singlet excitons generated at the host Host are transferred into singlet exited states of the phosphorescent dopant PD and the fluorescent dopant FD through Förster energy transfers FET5 and FET7. And singlet excitons generated at the phosphorescent dopant PD are transferred into singlet exited states of the fluorescent dopant FD through Förster energy transfer FET6.

Also, triplet excitons generated at the host Host are transferred into triplet exited states of the phosphorescent dopant PD and the fluorescent dopant FD through Dexter energy transfers DET4 and DET 6. Also, triplet excitons generated at the phosphorescent dopant PD are transferred into triplet exited states of the fluorescent dopant FD through Dexter energy transfer DET5. Herein, in the phosphorescent dopant PD, an energy transfer may be partially generated from the single excited state S1 into the triplet excited state T1 through an Intersystem Crossing (ISC) transfer, and then the transferred energy from the triplet excited state T1 into the ground state S0 may be released and also partial phosphorescence luminescence may be emitted from the phosphorescent dopant PD.

Furthermore, an energy of the triplet excited state T1 of the phosphorescent dopant PD is partially transferred to the singlet excited state S1 of the fluorescent dopant FD by the Förster energy transfer FET8 and is partially transferred to the triplet excited state T1 of the fluorescent dopant FD by the Dexter energy transfer DET5. In the fluorescent dopant FD, the energies by the Dexter energy transfers DET4-DET6 are transferred into the triplet excited state T1, and triplet excitons are generated by recombination in the fluorescent dopant FD. In the fluorescent dopant FD, when the triplet excited state T1 falls to the ground state S0, a non-radiative decay occurs due to heat dissipation rather than a light emission.

That is, even though the first experimental example uses different typed dopants, but since a Reverse Intersystem Crossing (RISC) transfer does not occur at the fluorescent dopant, the non-radiative decay occurs with fluorescence at the fluorescent dopant FD. Also, in the first experimental example, some phosphorescent emission is generated at the phosphorescent dopant PD, and thus a color purity of the light emission is low because partial phosphorescence and partial fluorescence which exhibits different color characteristics from phosphorescence are mixed in the light emitting layer.

Also, as shown in FIG. 4, the light emitting layer in the first experimental example should be set for the energy transfer from the phosphorescent dopant PD to the fluorescent dopant FD so that the PL spectrum 321 of the phosphorescent dopant PD almost overlaps the absorption spectrum 312 of the fluorescent dopant. In this case, a difference in Stokes Shift between the absorption spectrum 312 of the fluorescent dopant and the PL spectrum 311 is large, and thus emission peak characteristics between the phosphorescent dopant PD and the fluorescent dopant FD are different. In particular, as shown in FIG. 4A, when phosphorescence from the phosphorescent dopant and fluorescence from the fluorescent dopant occur simultaneously, different color light emissions are mixed, thus it is difficult to realize a unicolor emission.

As described above, in the first experimental example in which the light emitting layer contains the phosphorescent dopant and the fluorescent dopant having different emission colors, fluorescence is partially generated by converting some triplet excitons of the phosphorescent dopant into singlet excitons of the fluorescent dopant through the Forster energy transfer and phosphorescence is simultaneously generated in an excitation from the triplet excited state to the ground state in the phosphorescent dopant, thereby a mixed color light emission are induced in the light emitting layer. In the first experimental example, a concentration of the triplet excitons in the light emitting layer may be reduced, so that a lifetime can be increased compared to the phosphorescent light emitting device having only a single phosphorescent dopant, and a high efficiency can be realized compared to the fluorescent light emitting device having a single fluorescent dopant.

In the first experimental example, the triplet excitons by the Dexter energy transfer (from the triplet excited states of the phosphorescent dopant and the host into the triplet excited state of the fluorescent dopant) or the triplet excitons formed by charge recombination may be quenched due to a non-radiative decay, and thus an efficiency of the first experimental example tends to decrease compared to the phosphorescent device.

For the Forster energy transfer from the triplet excited state of the phosphorescent dopant to the singlet excited state of the fluorescent dopant, an overlap between the PL spectrum of the phosphorescent dopant and the absorption spectrum of the fluorescent dopant is beneficial. Since a generally known fluorescent dopant has a big Stokes shift, an emission wavelength of the PL spectrum of the phosphorescent dopant should be at a shorter wavelength than an emission wavelength of the fluorescent dopant for the overlap between the PL spectrum of the phosphorescent dopant and the absorption spectrum of the fluorescent dopant. Therefore, as shown in FIG. 4B, the first experimental example represents that the phosphorescent dopant has a blue emission and the fluorescent dopant has a green emission which has a certain gap from the blue emission. In this case, for the blue emission, the triplet excited state of the phosphorescent dopant should be higher than the singlet excited state of the blue fluorescent dopant. That is, the phosphorescent dopant having the higher triplet state is beneficial. However, the phosphorescent dopant having the higher triplet state must be formed by adjusting at least one substituent, and the phosphorescent dopant with the adjusted substituent have an unstable properties, so stability of the device is greatly reduced.

On the contrary, the light emitting layer of the organic light emitting device described in the FIGS. 1-3 simultaneously utilizes a higher efficiency of the phosphorescence, and higher color purity and a longer lifetime of the fluorescence. In the light emitting layer of FIGS. 1-3, the second dopant as a fluorescent dopant realizes thermally activated delayed fluorescence (TADF), and has a smaller Stokes shift so that the triplet excited state of the phosphorescent dopant (first dopant) is not higher and generation of the Spectral overlap between the PL spectrum of the first dopant and the absorption spectrum of the second dopant is enough provided. Finally providing the energy into the second dopant by the Forster energy transfer is facilitated. Also, the spectral overlap between the PL spectrum and the first dopant and the absorption spectrum of the second dopant is maximized through the second dopant having a small stokes shift so that the first dopant transmits energy to the second dopant almost without self-emission. In addition, the second dopant generates fluorescence emission and the thermally activated delayed fluorescence (TADF) by the reverse Intersystem Crossing transfer, thereby it is possible to reduce loss of the excitons in the light emitting layer and improve efficiencies.

The organic light emitting device of the present disclosure includes a host Host as a main matrix material in a single light-emitting layer. The host Host may include a single type of organic material or different organic materials. In the light emitting layer, the host Host functions for internal movement of holes and electron carriers transported through at least one common layer. The total amount of the first and second dopants D1 and D2 is within 40 wt % of the host Host. The first dopant D1 may be included in an amount of 1 wt % to 30 wt % of the host Host, and the second dopant D2 may be included may be included in an amount of 0.01 wt % to 10 wt %.

The first dopant D1 may be a phosphorescent dopant. In this case, for example, the first dopant D1 may be a metal complex compound including, as a core, iridium (Ir), platinum (Pt) or osmium (Os). However, the core metal of the first dopant D1 is not limited to examples listed, and may be changed to another metal if it has the relationship of FIG. 2 with respect to the second dopant D2 (a fluorescent dopant).

The second dopant D2 may be a material to have a small difference ($\Delta Est$) between the singlet excited state and the triplet excited state and capable of TADF. For an example, the second dopant D2 may be a boron-based compound.

The host Host in the organic light emitting device of the present disclosure may include at least one material which controls a transport of the internal carriers (electrons and holes) and a balance, and transfer energies to the first and second dopants D1 and D2. If the host Host, as a single material, functions to control the transport of the internal carrier and the balance, the host Host may be formed of a single material. Or the host Host may be formed of a plurality of materials to control the transport of the internal carrier and the balance. There are two types of a p-type host with a high hole transport mobility and an n-type host with a high electrode transport mobility. The light emitting layer of the present disclosure may use the both types of the p-type host and the n-type host, or two or more host that have the same type host but have different mobilities. In the light emitting layer, the host Host may be selected in consideration of the components of the first and second dopants D1 and D2 and an arrangement of common layers above and below the light emitting layer.

Meanwhile, the organic light emitting device of the present disclosure may use a phosphorescent dopant for the first dopant and a fluorescent dopant for the second dopant, and the first and second dopants D1 and D2 has the relationship between singlet and triplet as shown in FIG. 2. So it is characterized that a light emission is concentrated at the second dopant D2 through the energy transfer(s), and thus a uni-color emission is realized in the organic light emitting device of the present disclosure.

Hereinafter, various embodiments of the organic light emitting device of the present disclosure will be described. Explanation may be described in comparison with the device of FIG. 1 and its modified examples of FIG. 1.

Figure 5:
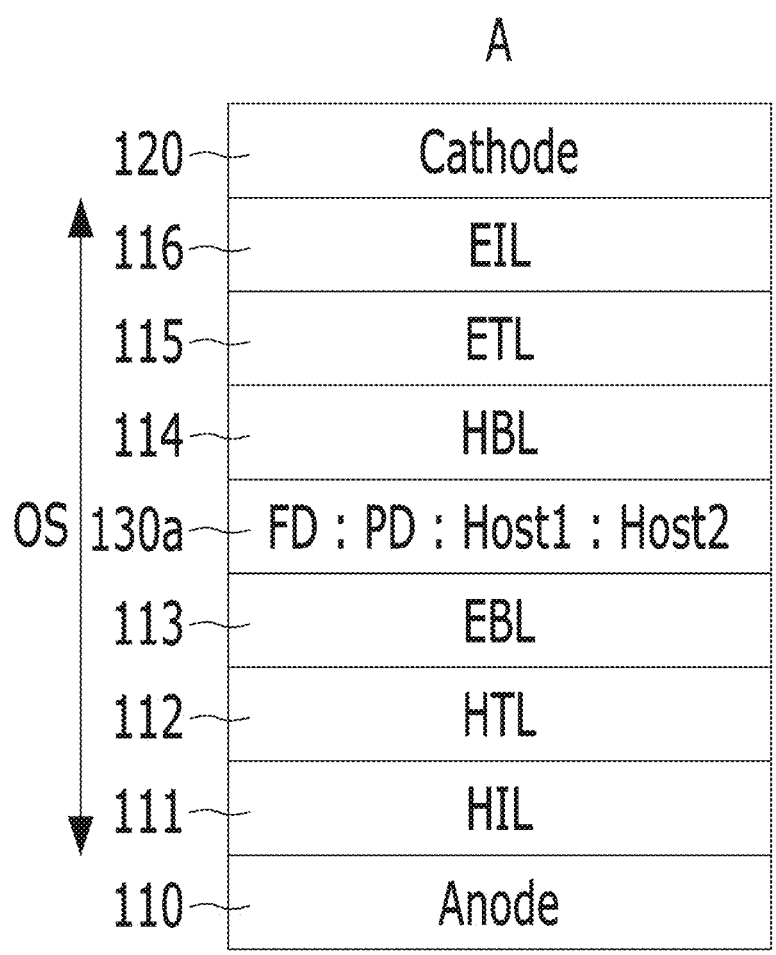
FIG. 5 is a cross-sectional view illustrating an organic light emitting device according to a first embodiment of the present disclosure.

FIG. 5 is a cross-sectional view illustrating an organic light emitting device according to a first embodiment of the present disclosure.

As shown in FIG. 5, the organic light emitting device (A) according to a first embodiment of the present disclosure comprises a light emitting layer 130a provided between a first electrode 110 and a second electrode 120 arranged opposite each other. A first common layer is positioned between the first electrode 110 and the light emitting layer 130a. An the first common layer may include hole injection layer (HIL) 111, a hole transport layer (HTL) 112 and an electron blocking layer (EBL) 113. A second common layer is positioned between the light emitting layer 130a and the second electrode 120 and the second common layer may include a hole blocking layer (HBL) 114, an electron transport layer (ETL) 115 and an electron injection layer (EIL) 116. The electron blocking layer 113 and the hole blocking layer 114 function to block electrons and holes and to confine excitons in the light emitting layer 130a since the triplet energy levels and single energy levels of the electron blocking layer 113 and the hole blocking layer 114 are higher than or same to the triplet energy level and single energy level of host in the light emitting layer 130a.

The light emitting layer 130a uses two hosts Host1 and Host2 and a phosphorescent dopant PD for the first dopant and a fluorescent dopant FD for the second dopant. As stated above, the two hosts Host1 and Host2 may be the p-type host and the n-type host, respectively. The first and second Hosts Host1 and Host2 have PL spectrums to transfer energies to the first and second dopants PD and FD.

The configuration between the first and second electrode 110 and 120 may be an organic stack OS mainly having organic materials therein. In some cases, the hole injection layer 111 and the electron injection layer 116 may include an inorganic material or an inorganic compound, and in the hole injection layer 111 and the electron injection layer 116, amount of the included inorganic material or the included inorganic compound may be greater than that of the organic material or may be composed of only inorganic material or inorganic compound.

Also, each function layer in the organic stack OS may be a single layer or multiple layers.

Figure 6:
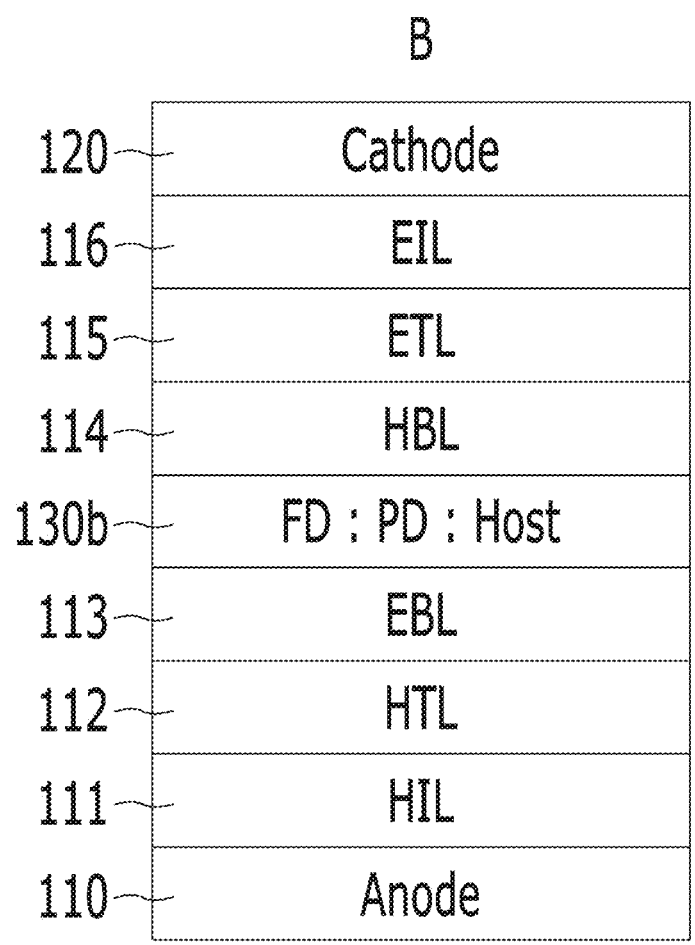
FIG. 6 is a cross-sectional view illustrating an organic light emitting device according to a second embodiment of the present disclosure.

FIG. 6 is a cross-sectional view illustrating an organic light emitting device according to a second embodiment of the present disclosure.

As shown in FIG. 6, the organic light emitting device according to the second embodiment of the present disclosure has the same structure except a light emitting layer 130b. The organic light emitting device according to the second embodiment of the present disclosure has the single host in the light emitting layer 130b. In this case, the single host Host may be selected from a material capable of Förster energy transfer and Dexter energy transfer into the first and second dopants PD and FD.

Figure 7:
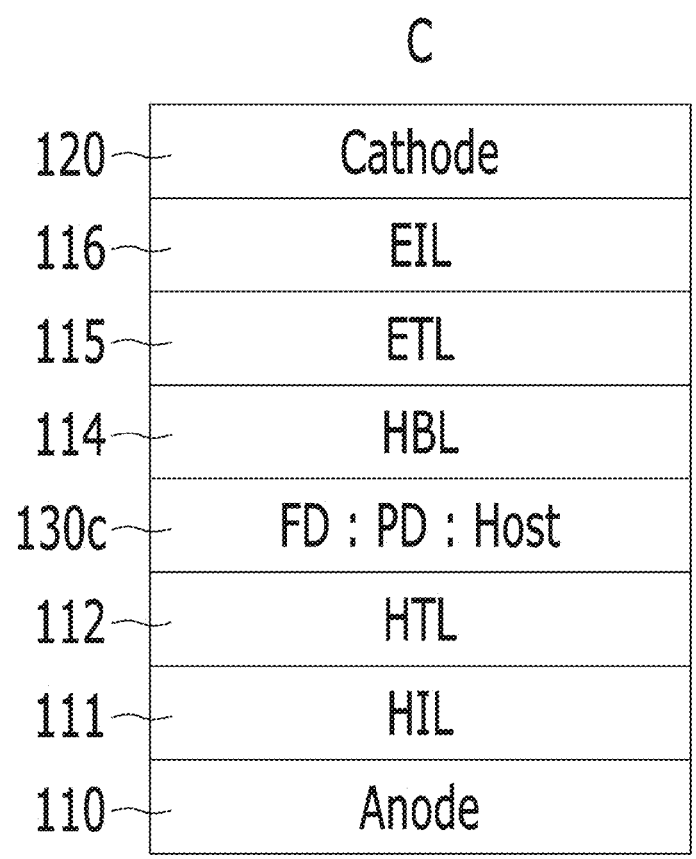
FIG. 7 is a cross-sectional view illustrating an organic light emitting device according to a third embodiment of the present disclosure.

FIG. 7 is a cross-sectional view illustrating an organic light emitting device according to a third embodiment of the present disclosure.

As shown in FIG. 7, the organic light emitting device according to the third embodiment of the present disclosure does not have an electron blocking layer under a light emitting layer 130c and the light emitting layer 130c is in contact with the hole transport layer 112.

Figure 8:
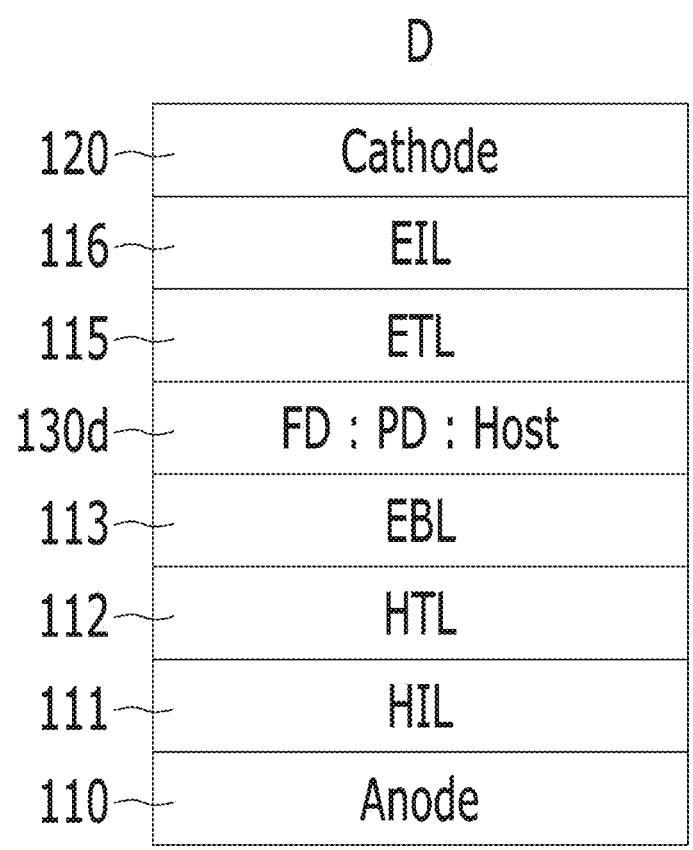
FIG. 8 is a cross-sectional view illustrating an organic light emitting device according to a fourth embodiment of the present disclosure.

FIG. 8 is a cross-sectional view illustrating an organic light emitting device according to a fourth embodiment of the present disclosure.

As shown in FIG. 8, the organic light emitting device according to the fourth embodiment of the present disclosure differs only in that it does not have a hole blocking layer on the light emitting layer 130d, and is the same as the second embodiment. The light emitting layer 130d of the fourth embodiment of the present disclosure is in contact with the electron transport layer 115.

In the organic light emitting device according to the above described third and fourth embodiments, the host provided in the light emitting layer may include a plurality of hosts having different properties.

The organic light emitting device according to the first to fourth embodiments have common feature to use the first and second dopants of different properties and to select the second dopant capable of fluorescence emission with TADF, thus the organic light emitting device according to the first to fourth embodiments have the common effect to emit uni-color light.

The organic light emitting device of the present disclosure may be applied to a tandem device including a plurality of stacks as well as a single stack configuration having a single light emitting layer as the aforementioned light emitting layer.

In the case of a tandem device, mixed light of color emitted from light emitting layers provided may finally appear on an emission side. And the tandem device may be used as a white light emitting device by providing different color light emitting layers.

Hereinafter, a fifth embodiment and a sixth embodiment of present disclosure are introduced as a white light emitting device.

Figure 9A:
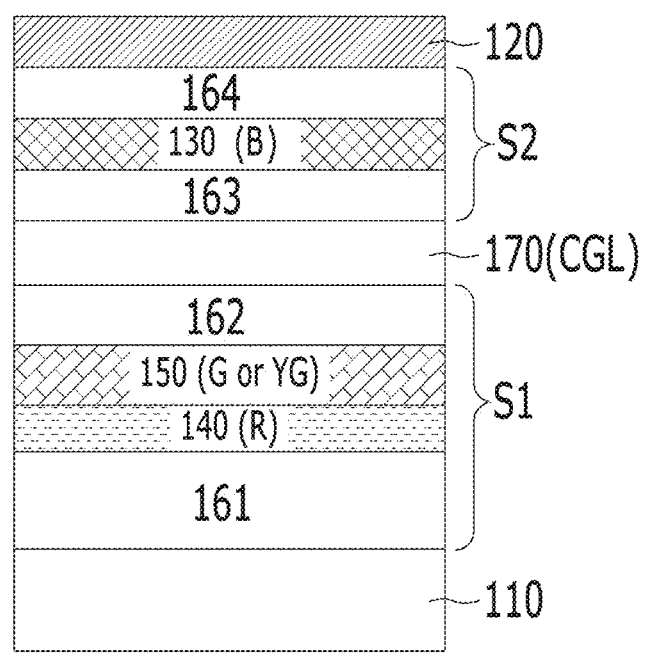
FIG. 9A is a cross-sectional view illustrating an organic light emitting device according to a fifth embodiment of the present disclosure.
Figure 9B:
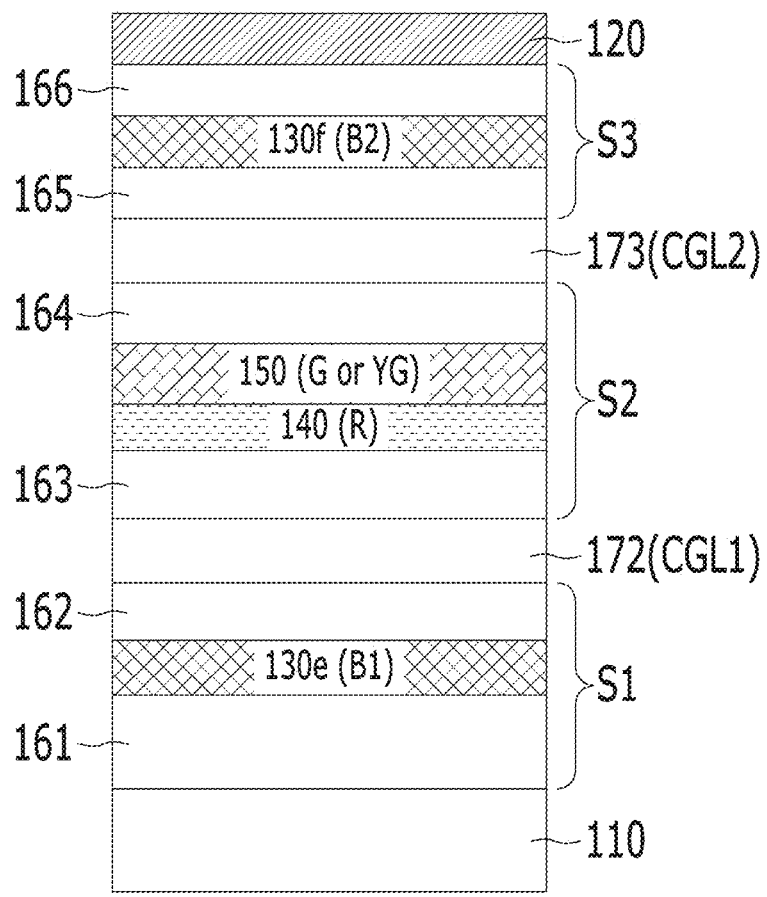
FIG. 9B is a cross-sectional view illustrating an organic light emitting device according to a sixth embodiment of the present disclosure.

FIG. 9A is a cross-sectional view illustrating an organic light emitting device according to a fifth embodiment of the present disclosure and FIG. 9B is a cross-sectional view illustrating an organic light emitting device according to a sixth embodiment of the present disclosure.

As shown in FIG. 9A, the organic light emitting device according to the fifth embodiment of the present disclosure includes a first electrode 110 and a second electrode 120 arranged opposite each other, a first stack S1 and second stack S2, and a charge generation layer (CGL) 170 between the first and second stacks S1 and S2.

The first stack S1 includes a first hole transport related common layer 161, a red light emitting layer 140, a green or yellow-green light emitting layer 150 and a first electron transport related common layer 162, stacked on the first electrode 110.

The second stack S2 includes a second hole transport related common layer 163, a blue light emitting layer 130 and a second electron transport related common layer 164, stacked on the charge generation layer 170.

The charge generation layer 170 may be a single layer which a p-type dopant and an n-type dopant are doped in or may be formed of stacking an n-type charge generation layer and a p-type charge generation layer.

The first and second hole transport related common layers 161 and 163, for an example, may be at least one of the hole injection layer, the hole transport layer and the electron blocking layer described in the first example.

The first and second electron transport related common layers 162 and 164, for an example, may be at least one of the hole blocking layer, the electron transport layer and the electron injection layer described in the first example.

The organic light emitting device according to the fifth embodiment of the present disclosure includes the light emitting layer 130 configured of FIGS. 1-3 in the second stack S2. The light emitting layer 130 includes a host Host, a first dopant D1 of a phosphorescent dopant and a second dopant D2 of a fluorescent dopant. From the host Host and the first dopant D1, the Förster energy transfer and Dexter energy transfer is generated into the second dopant D2. In particular, the energy transferred to the triplet excited state of the second dopant D2 through the Dexter energy transfer, is again transferred into the singlet excited state in the second dopant D2 by the reverse Intersystem crossing RISC transfer and used in TADF. That is, the first dopant D1 of the phosphorescent dopant is sensitized and then fluorescence occurs by the phosphor-sensitized fluorescence (PSF) method in the light emitting layer. As shown in FIG. 3, the second dopant D2 represents a blue emission.

A red light emitting layer 140 and a green or yellow-green light emitting layer 150 provided in the first stack S1 may be a phosphorescent layer or a fluorescent layer, respectively. In some cases, at least one of the red light emitting layer 140 and the green or yellow-green light emitting layer 150 may include dopants of different types to enable the phosphor-sensitized fluorescence (PSF) as shown in FIGS. 2-3.

As shown in FIGS. 9B, the sixth embodiment organic light emitting device according to the sixth embodiment of the present disclosure includes first and second blue stacks S1 and S3 disposed above and below a long wavelength stack S2. The sixth embodiment requires a further blue stack than the fifth embodiment.

Charge generation layers 172 and 173 are between adjacent stacks S1, S2, S3.

The first and second blue stacks S1, S3 includes a first common layer related to hole transport 161 and 165, a blue light emitting layer 130e can 130f, and second common layer related to electron transport.

The long wavelength stack includes a third common layer related to hole transport 163, a red light emitting layer 140, a green or yellow-green light emitting layer 150 and a fourth common layer related to electron transport related common layer 162, stacked as aforementioned in FIG. 9A.

Since the organic light emitting device according to the sixth embodiment has the further blue stack than the fifth embodiment, the organic light emitting device according to the sixth embodiment is possible to achieve a deep blue emission with a high efficiency by compensating emitting efficiency of the blue light emitting layer.

In case of having the blue light emitting layer capable of the PSF of the present disclosure, the energy transfer from the first dopant is additionally performed to the second dopant according to the energy transfer mechanism and own TADF is generated in the second dopant, thus 100% internal quantum efficiency can be theoretically realized. That is, it is possible to improve the efficiency of 1.5 to 2 times that of a structure having a single fluorescent dopant. Even if the blue stack is configured as a single unit, the organic light emitting device according to the fifth embodiment can have same or more effect as the organic light emitting device having two blue fluorescent stacks of single fluorescent dopant.

The present disclosure can have a superior efficiency compared to a structure having a single fluorescent dopant as a dopant in the light emitting layer and have an improved lifetime compared to a phosphorescent dopant as a dopant in the light emitting layer. In addition, even if the stack structure is simplified into 2 stacks, the present disclosure has a similar efficiency as the 3 stack with dual blue stacks each using the blue light emitting layer having the single fluorescent dopant as a dopant. Therefore, the present disclosure according to the fifth embodiment can have high efficiency even by driving a small voltage.

Figure 10:
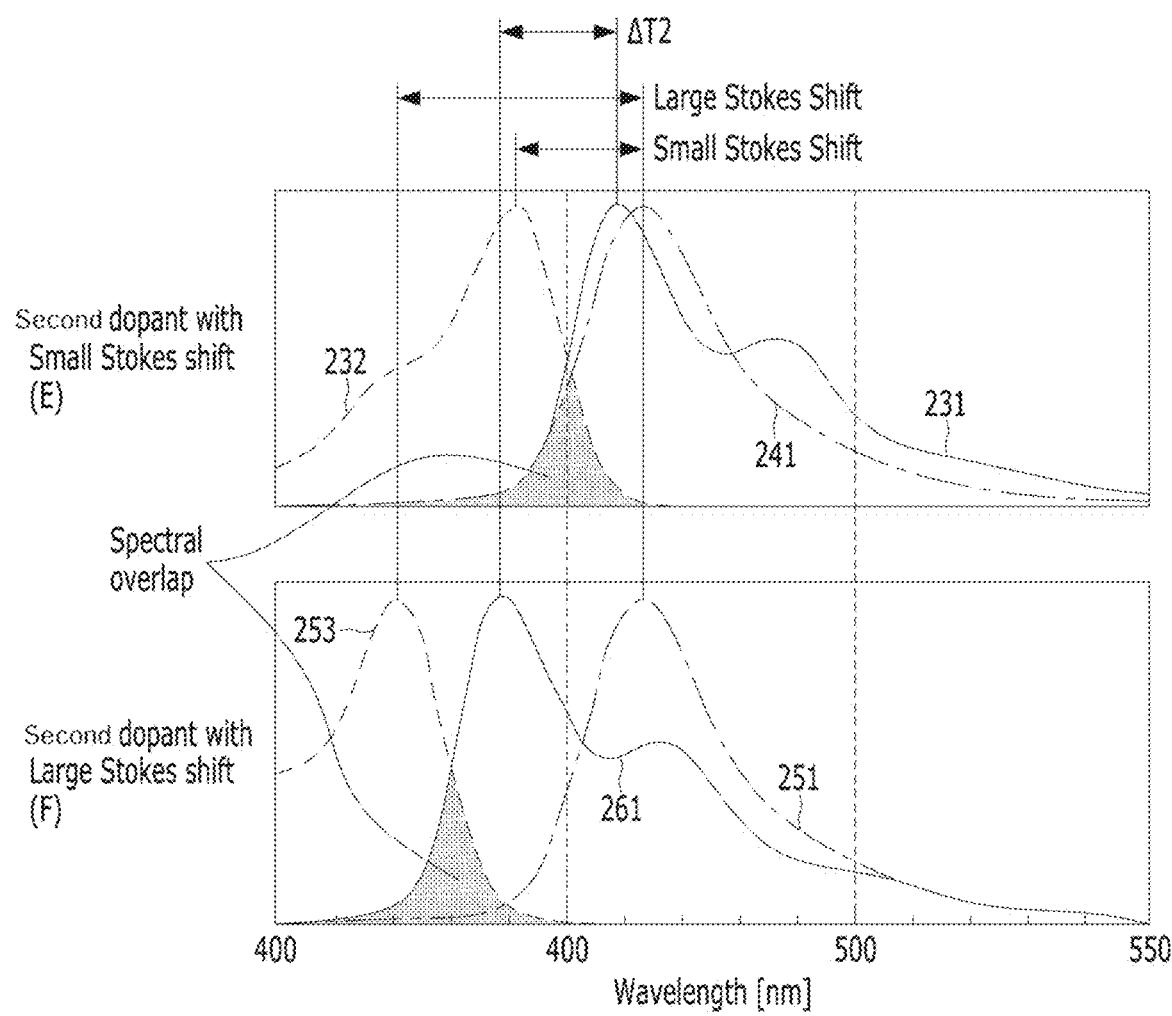
FIG. 10 are graphs showing the PL spectrums in modified embodiments of the present disclosure having different Stokes shift characteristics of the second dopant.
Figure 11A:
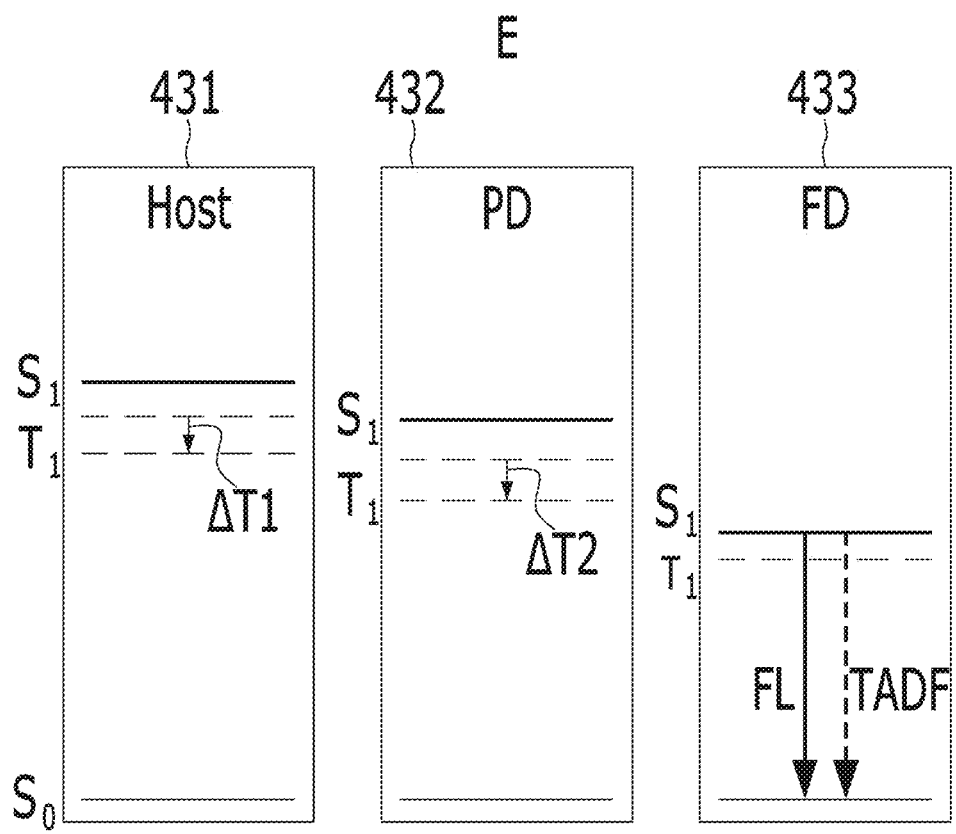

FIG. 10 are graphs showing the PL spectrums in modified embodiments of the present disclosure having different Stokes shift characteristics of the second dopant, and FIGS. 11A and 11B are views illustrating energy transfer relationships in modified embodiments of FIG. 10.

FIG. 10 shows spectrum characteristics according to used dopants in the second experimental example and the third experimental examples.

In FIG. 10, the Stokes shift is generated in the fluorescent dopant which has a main emission, and it means a difference between a peak wavelength of the absorption spectrum 232 and a peak wavelength of the PL spectrum 231 in the fluorescent dopant.

The second experimental example (E) represents spectrums of the light emitting layer having a fluorescent dopant of a small stokes shift characteristics, and the third experimental example (F) represents spectrums of the light emitting layer having a fluorescent dopant of a big stokes shift characteristics. As shown in FIGS. 11A and 11B, the second and third experimental examples (E) and (F) have a similar spectral overlap between the PL spectrum 241, 261 of the first dopant (phosphorescent dopant) and the absorption spectrum 232, 253 of the second dopant (fluorescent dopant) and thus have similar energy transfer due to the spectral overlap.

Comparing the second experimental example (E) of FIG. 11A and the third experimental example (F) of FIG. 11B, the second experimental example (E) can relatively lower energy levels of the triple excited states of the host 431 and the first dopant 432. That is, the triplet excited state of the host 431 in the second experimental example (E) is lowered than the triplet excited state of the host 441 in the third experimental example (F) with a first level difference of ΔT1. Similarly, the triplet excited state of the first dopant 432 in the second experimental example (E) is lowered than the triplet excited state of the first dopant 442 in the third experimental example (F) with a first level difference of ΔT2.

In the first experimental example of FIGS. 4A and 4B, the internal quantum efficiency is decreased due to the non-radiative decay generated in the fluorescent dopant, whereas, the light emitting layer of present disclosure, as shown in FIGS. 2 and 3, converts triplet excitons generated to the singlet excitons through RISC transfer in the second dopant, by applying the second dopant with a fluorescent dopant capable of TADF and thus may suppress loss of the internal quantum efficiency.

Although the boron-based fluorescent dopant emits in a region similar to the emission wavelength of the phosphorescent dopant, as the second experimental example shown in FIG. 10, the spectral overlap between the absorption spectrum of the fluorescent dopant and the PL spectrum of the phosphorescent dopant is generated and thus the Förster energy transfer from the triplet excited state into the singlet excited state of the fluorescent dopant is induced. That is, by the small Stokes shift of the fluorescent dopant, the spectral overlap between the absorption spectrum of the fluorescent dopant and the PL spectrum of the phosphorescent dopant is facilitated.

As shown in the third experimental example of FIG. 10, in the case of a fluorescent dopant having a relatively big Stokes shift, since the PL spectrum of the phosphorescent dopant should be shifted to a shorter wavelength for spectral overlap between the absorption spectrum of the fluorescent dopant and the PL spectrum of the phosphorescent dopant, the triplet excited state of the phosphorescent dopant in the third experimental example is required higher than the triplet excited state of the phosphorescent dopant in the second experimental example. Such higher triplet excited state in the phosphorescent dopant also requires a further higher triplet excited state of the host for the energy transfer from the host Host to dopants PD and FD in the third experimental example. Such required higher triplet excited states increases difficulty of molecular design of the host and phosphorescent dopant PD. Therefore, it means that there are difficulties to select the host Host and the phosphorescent dopant PD used in the light emitting layer of the third experimental example, and the third experimental example (F) having the big Stokes Shift may lower electrical and optical stabilities.

The light emitting layer of the present disclosure, as shown in the second experimental example, makes possible to improve the electrical and optical stabilities of the device, by minimizing required triplet excited state for the first dopant (phosphorescent dopant).

Also, in the light emitting layer of the present disclosure, by increasing the spectral overlap between the absorption spectrum of the fluorescent dopant and the PL spectrum of the phosphorescent dopant, the triplet excitons of the phosphorescent dopant are rapidly converted into the singlet excited state of the fluorescent dopant, so the lifetime of the triplet excitons is reduced and the stability of the device are improved.

Compared to a fluorescent blue dopant having a wide FWHM in a fluorescent emitting device, in the present disclosure, each of the triplet excited states of the phosphorescent dopant and the host may be lowered and thus the electrical and optical stabilities are secured and color purity is improved.

Hereinafter, various embodiments of the present disclosure will be described with respect to an energy transfer and spectrum characteristics.

Figure 12A:
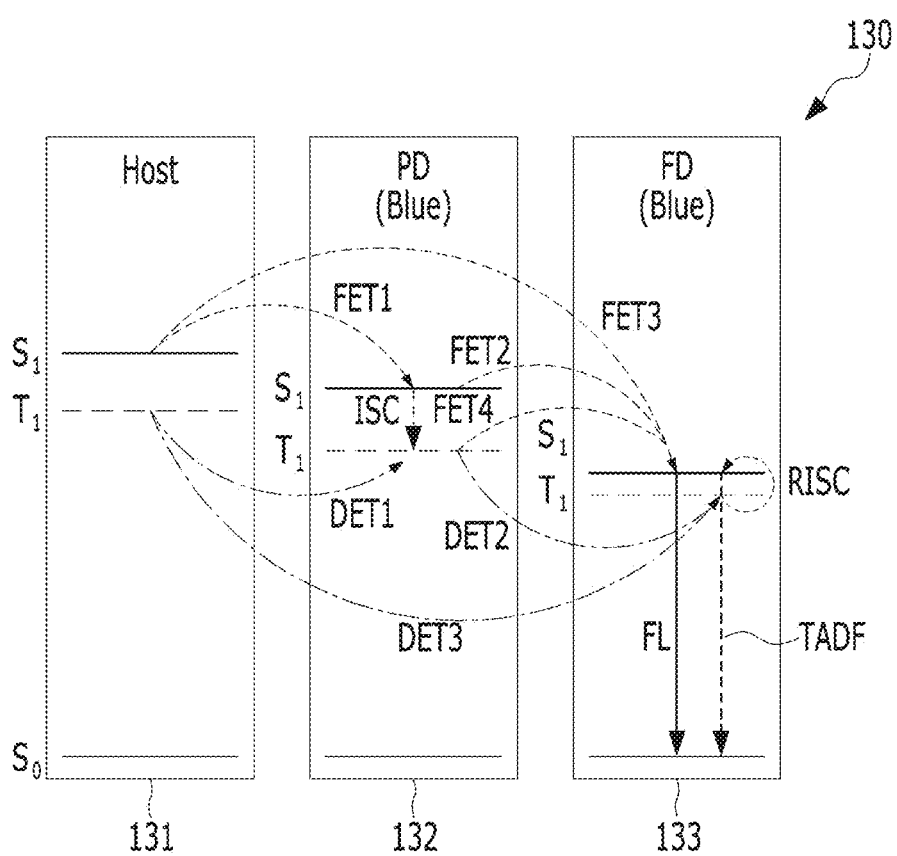
FIGS. 12A and 12B are a view illustrating energy transfer relation and a graph showing the PL spectrums in the light emitting layer according to a seventh embodiment of the present disclosure.
Figure 12B:
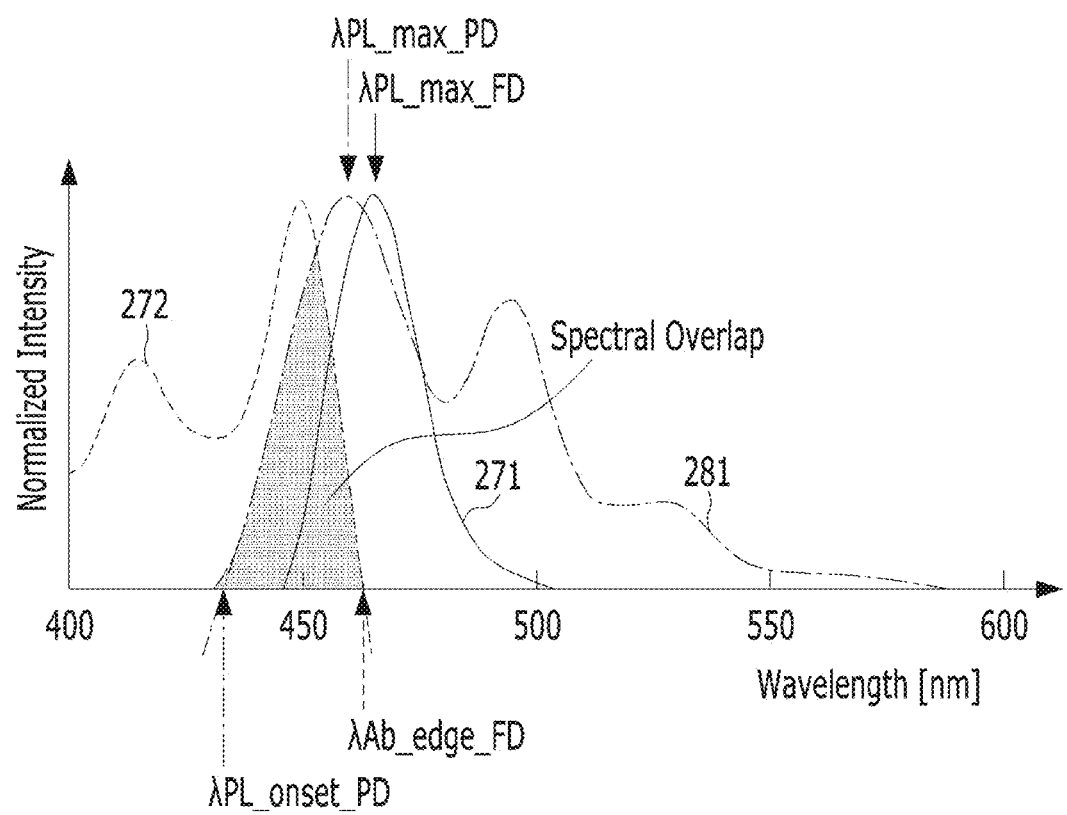

FIGS. 12A and 12B are a view illustrating energy transfer relation and a graph showing the PL spectrums in the light emitting layer according to a seventh embodiment of the present disclosure.

As shown in FIG. 12A, the organic light emitting device according to the seventh embodiment of the present disclosure includes a blue light emitting layer 130. Also, the blue light emitting layer 130 includes at least one host Host, a first dopant PD (blue) to which energy is transferred from the host, and a second dopant FD (blue) to which energy is transferred from the host and the first dopant.

The energy transfer and excitation mechanism of each component in the light emitting layer 130 are the same as those of FIGS. 1 to 3, and descriptions of the same parts are omitted.

As shown in FIG. 12B, in the blue light emitting layer 130 of the organic light emitting device according to the seventh embodiment of the present disclosure, the peak wavelength of the PL spectrum 281 of the first dopant PD (Blue) has a difference within 30 nm from the peak wavelength of the PL spectrum 271 of the second dopant FD (Blue), and the PL spectrum 281 of the first dopant PD(blue) spectrally overlaps the absorption spectrum 272 of the second dopant FD (Blue) with a big area since the Stokes shift between the absorption spectrum 272 and the PL spectrum 271 in the second dopant FD (Green) is small, so energy transfer from the first dopant PD to the second dopant FD is facilitated by the big spectral overlap.

The organic light emitting device according to the seventh embodiment of the present disclosure can emit uniform blue color light since energy from the first dopant PD is transferred to the second dopant FD, and fluorescence and the thermally activated delayed fluorescence (TADF) are commonly generated at the singlet excited state of the second dopant FD. The first dopant PD is a phosphorescent dopant having the metal core aforementioned, and the second dopant FD is a fluorescent dopant capable of TADF. The second dopant FD may be selected from the Chemical Formulae 1 to 9. The light emitting layer of the organic light emitting device according the seventh embodiment represents emission at approximately 430 nm to 480 nm.

Figure 13A:
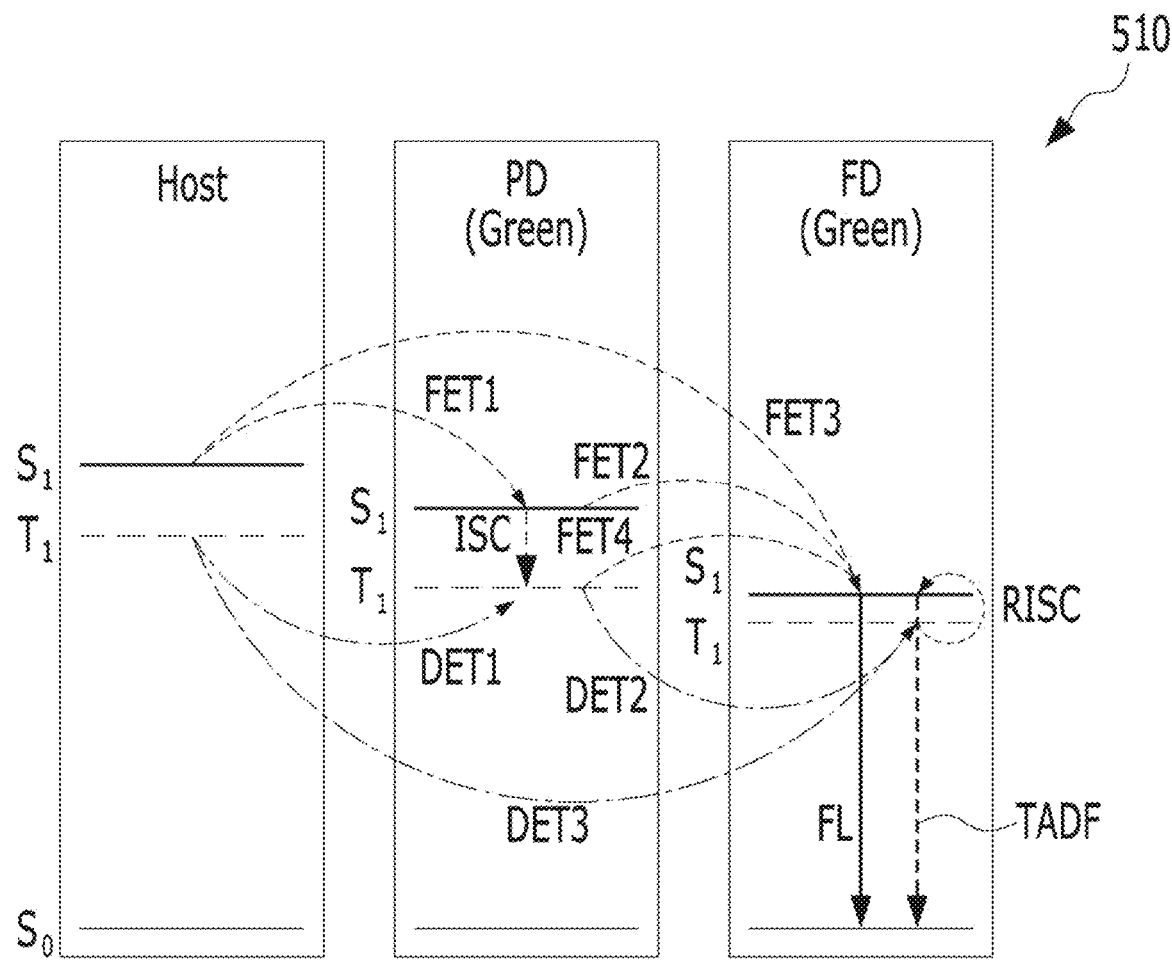
FIGS. 13A and 13B are a view illustrating energy transfer relation and a graph showing the PL spectrums in the light emitting layer according to an eighth embodiment of the present disclosure.
Figure 13B:
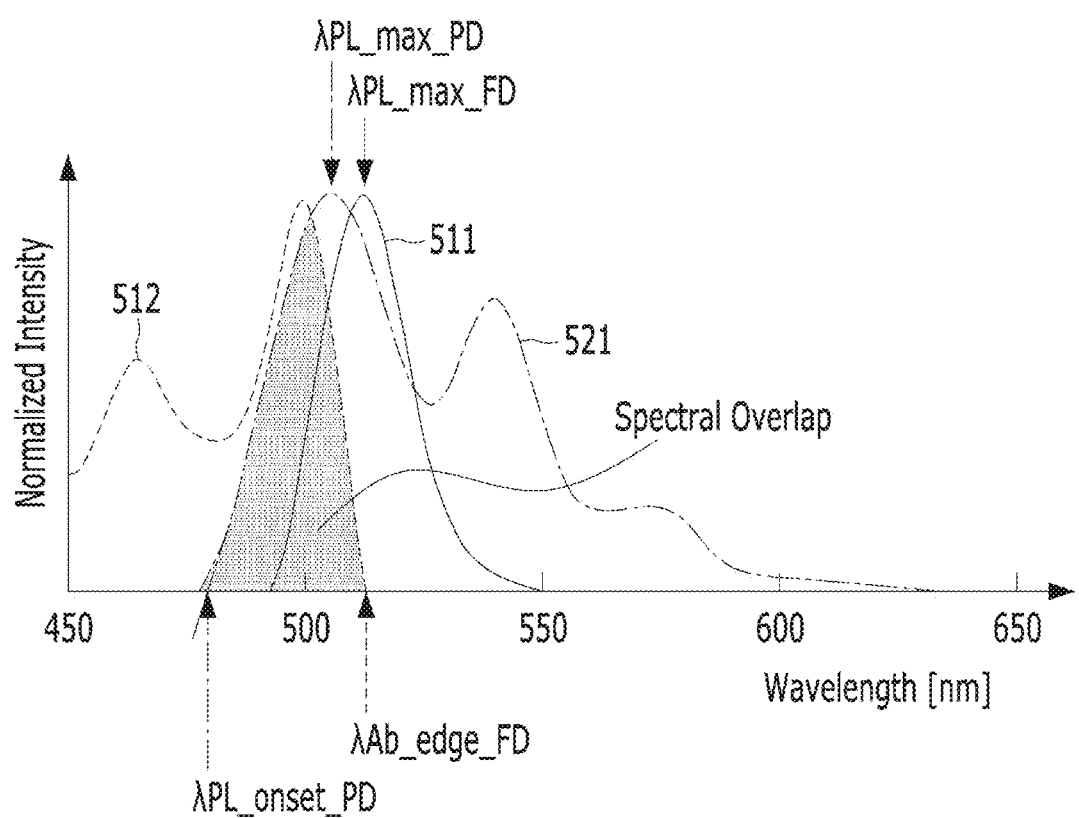

FIGS. 13A and 13B are a view illustrating energy transfer relation and a graph showing the PL spectrums in the light emitting layer according to an eighth embodiment of the present disclosure.

As shown in FIG. 13A, the organic light emitting device according to the eighth embodiment of the present disclosure includes a green light emitting layer 510. Also, the green light emitting layer 510 includes at least one host Host, a first dopant PD (Green) to which energy is transferred from the host, and a second dopant FD (Green) to which energy is transferred from the host and the first dopant.

The second dopant D2, for example, may be selected from shown in the following Chemical Formulas 10 to 13, or modified examples thereof.

[Chemical Formula 10]

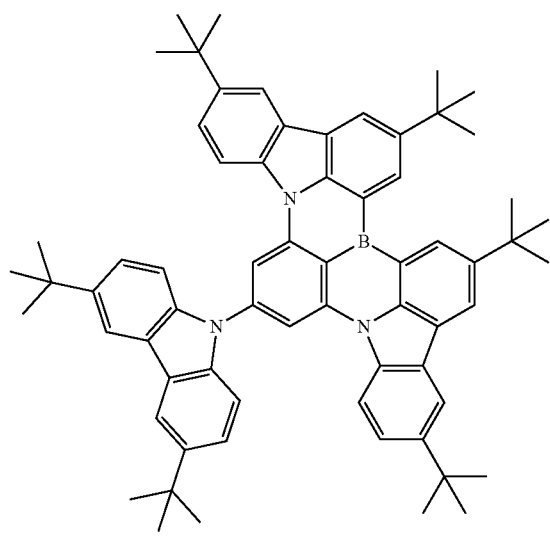

[Chemical Formula 11]

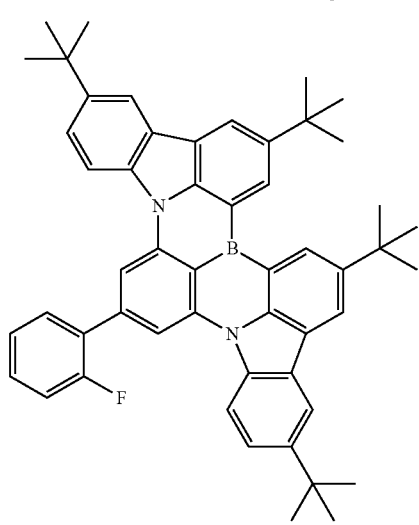

[Chemical Formula 12]

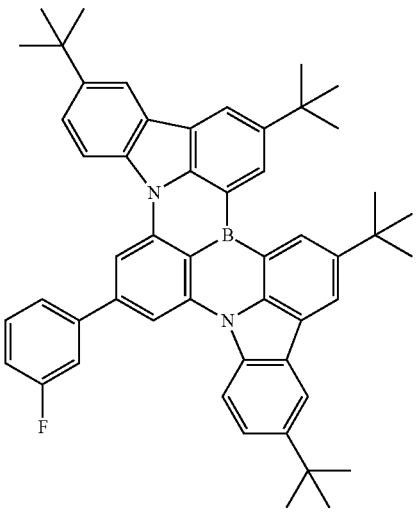

[Chemical Formula 13]

The energy transfer and excitation mechanism of each component in the light emitting layer are the same as those of FIGS. 1 to 3, and descriptions of the same parts are omitted.

As shown in FIG. 13B, in the green light emitting layer 510 of the organic light emitting device according to the seventh embodiment of the present disclosure, the peak wavelength of the PL spectrum 521 of the first dopant PD (Green) has a difference within 30 nm from the PL peak wavelength of the PL spectrum 511 of the second dopant FD (Green), and the PL spectrum 521 of the first dopant PD(Green) spectrally overlaps the absorption spectrum 512 of the second dopant FD (Green) with a big area since the Stokes shift between the absorption spectrum 512 and the PL spectrum 511 in the second dopant FD (Green) is small, so energy transfer from the first dopant PD to the second dopant FD is facilitated by the big spectral overlap.

The organic light emitting device according to the seventh embodiment of the present disclosure can emit uniform green color light since energy from the first dopant PD is transferred to the second dopant FD, and fluorescence with the thermally activated delayed fluorescence (TADF) are commonly generated at the singlet excited state of the second dopant FD. The first dopant PD is a phosphorescent dopant having the metal core aforementioned, and the second dopant FD is a fluorescent dopant capable of TADF. The second dopant FD may be selected from the Chemical Formulae 10 to 13. The green light emitting layer of the organic light emitting device according the eighth embodiment represents emission at approximately 500 nm to 560 nm.

Figure 14A:
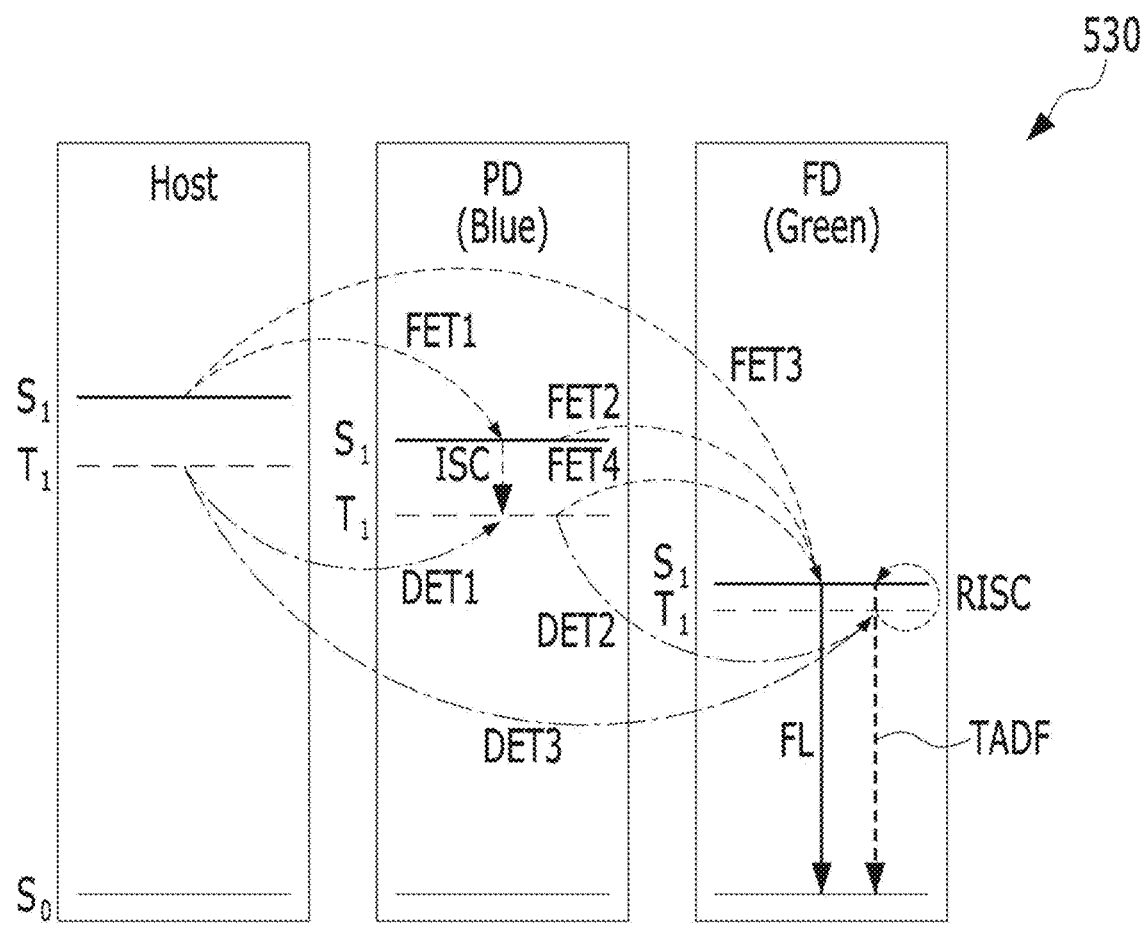
FIGS. 14A and 14B are a view illustrating energy transfer relation and a graph showing the PL spectrums in the light emitting layer according to a ninth embodiment of the present disclosure.
Figure 14B:
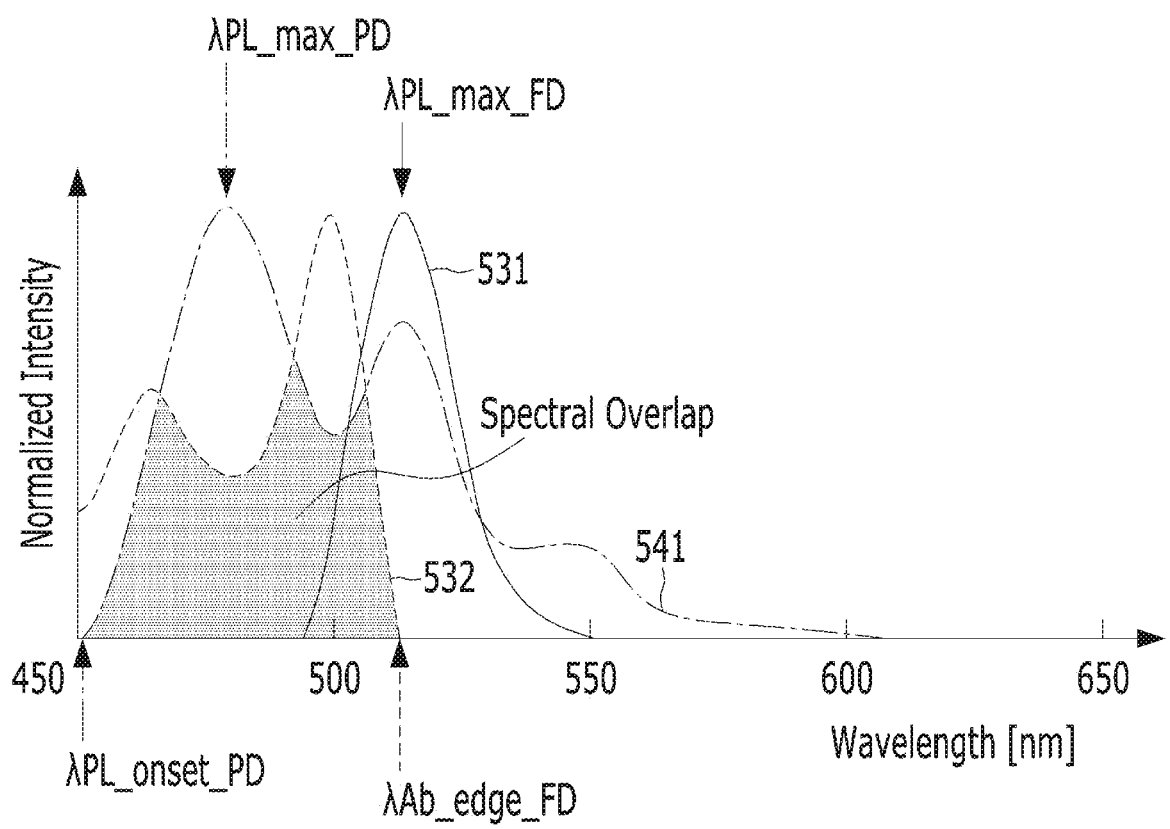

FIGS. 14A and 14B are a view illustrating energy transfer relation and a graph showing the PL spectrums in the light emitting layer according to a ninth embodiment of the present disclosure.

As shown in FIG. 14A, the organic light emitting device according to the ninth embodiment of the present disclosure includes a green light emitting layer 530. Also, the green light emitting layer 530 includes at least one host Host, a first dopant PD (Blue) to which energy is transferred from the host, and a second dopant FD (Green) to which energy is transferred from the host and the first dopant.

The ninth embodiment is different from the eighth embodiment in that the first dopant PD (Blue) has blue emission properties, not green emission properties. In this case, as shown in FIG. 14B, in the green light emitting layer 530 of the organic light emitting device according to the ninth embodiment of the present disclosure, the peak wavelength of the PL spectrum 531 of the second dopant FD (Green) has a difference of 35 nm to 60 nm from the PL peak wavelength of the PL spectrum 541 of the first dopant PD (Blue), and the first dopant PD (Blue) and the second dopant FD (Green) have the different emission properties. However, in the organic light emitting device according to the ninth embodiment of the present disclosure, from the first dopant PD (Blue) to the second dopant FD (Green), energy transfers from the first dopant PD (Blue) to the second dopant FD is facilitated by the big spectral overlap with the Förster energy transfer and thus fluorescence are generated at the second dopant. In addition, in the second dopant FD (Green), the TADF is generated with the Dexter energy transfer DET2 according to electron exchange of triplet excitons between the host Host and first dopant PD (Blue), and the second dopant FD (Green) and the Reverse Intersystem Crossing (RICS) transfer between the triplet excited state T1 to the single excited state S1. Therefore, the green light emitting layer of the organic light emitting device according the ninth embodiment may represent emission at approximately 500 nm to 560 nm.

The energy transfer and excitation mechanism of each component in the light emitting layer 130 are the same as those of FIGS. 1 to 3, and descriptions of the same parts are omitted.

Figure 15A:
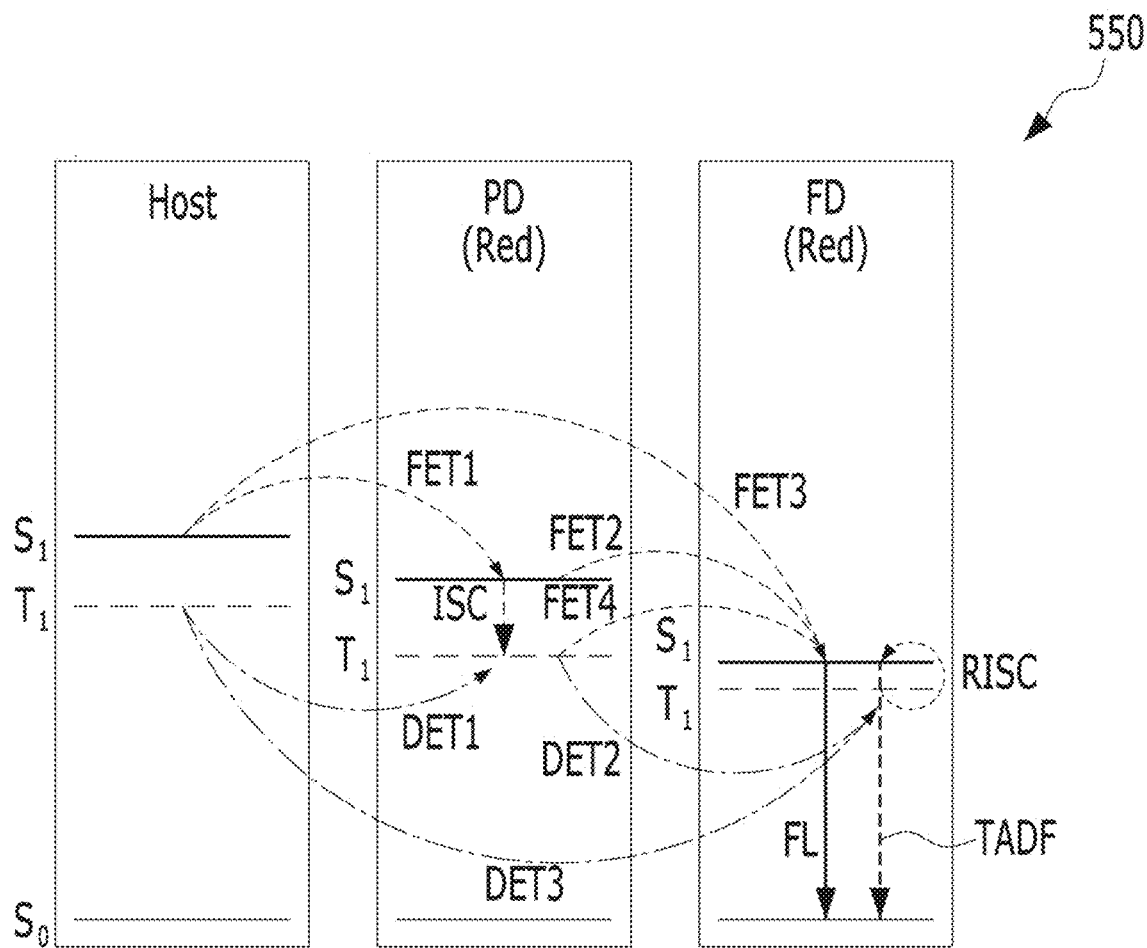
FIGS. 15A and 15B are a view illustrating energy transfer relation and a graph showing the PL spectrums in the light emitting layer according to a tenth embodiment of the present disclosure.
Figure 15B:
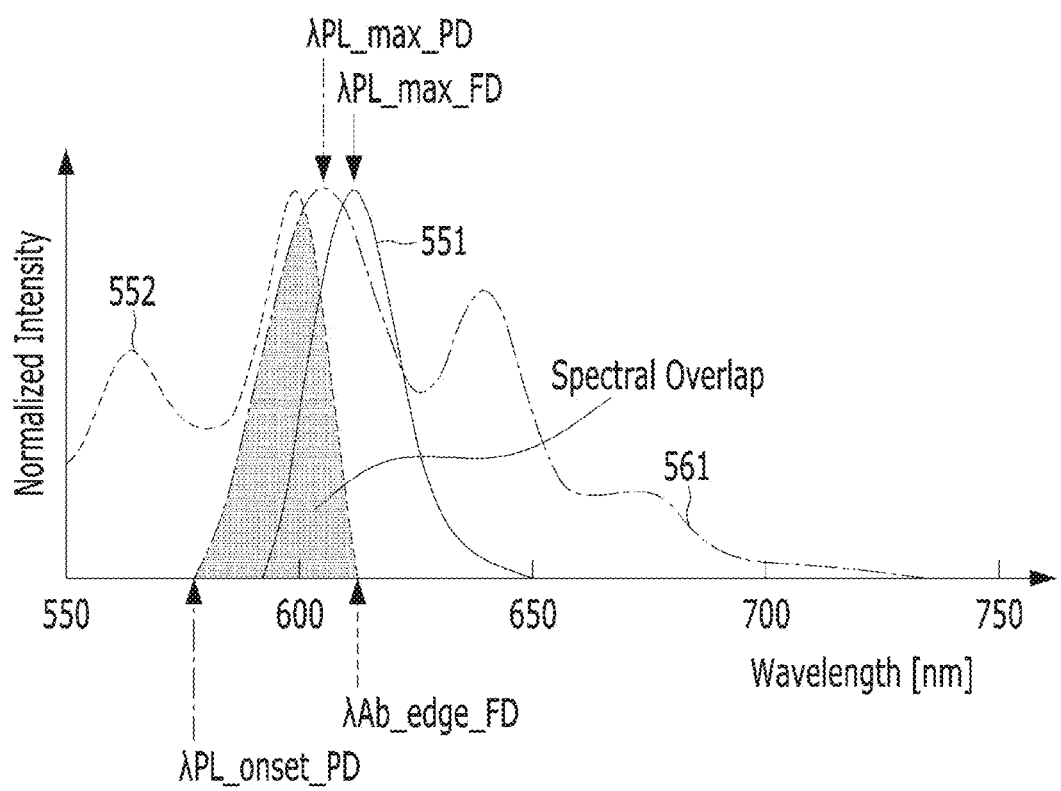

FIGS. 15A and 15B are a view illustrating energy transfer relation and a graph showing the PL spectrums in the light emitting layer according to a tenth embodiment of the present disclosure.

As shown in FIG. 15A, the organic light emitting device according to the tenth embodiment of the present disclosure includes a red light emitting layer 550. Also, the red light emitting layer 550 includes at least one host Host, a first dopant PD (Red) to which energy is transferred from the host, and a second dopant FD (Red) to which energy is transferred from the host and the first dopant.

The energy transfer and excitation mechanism of each component in the light emitting layer are the same as those of FIGS. 1 to 3, and descriptions of the same parts are omitted.

As shown in FIG. 15B, in the red light emitting layer 550 of the organic light emitting device according to the seventh embodiment of the present disclosure, the peak wavelength of the PL spectrum 561 of the first dopant PD (Red) has a difference within 30 nm from the PL peak wavelength of the PL spectrum 551 of the second dopant FD (Red), and the PL spectrum 561 of the first dopant PD(Red) spectrally overlaps the absorption spectrum 552 of the second dopant FD (Red) with a big area since the Stokes shift between the absorption spectrum 552 and the PL spectrum 551 in the second dopant FD (Red) is small, so energy transfer from the first dopant PD to the second dopant FD is facilitated by the big spectral overlap.

The organic light emitting device according to the tenth embodiment of the present disclosure can emit uniform red color light since energy from the first dopant PD is transferred to the second dopant FD, and fluorescence with the thermally activated delayed fluorescence (TADF) are commonly generated at the singlet excited state of the second dopant FD. The first dopant PD is a phosphorescent dopant having the metal core aforementioned, and the second dopant FD is a fluorescent dopant capable of TADF. The red light emitting layer of the organic light emitting device according the tenth embodiment represents emission at approximately 600 nm to 700 nm.

Figure 16A:
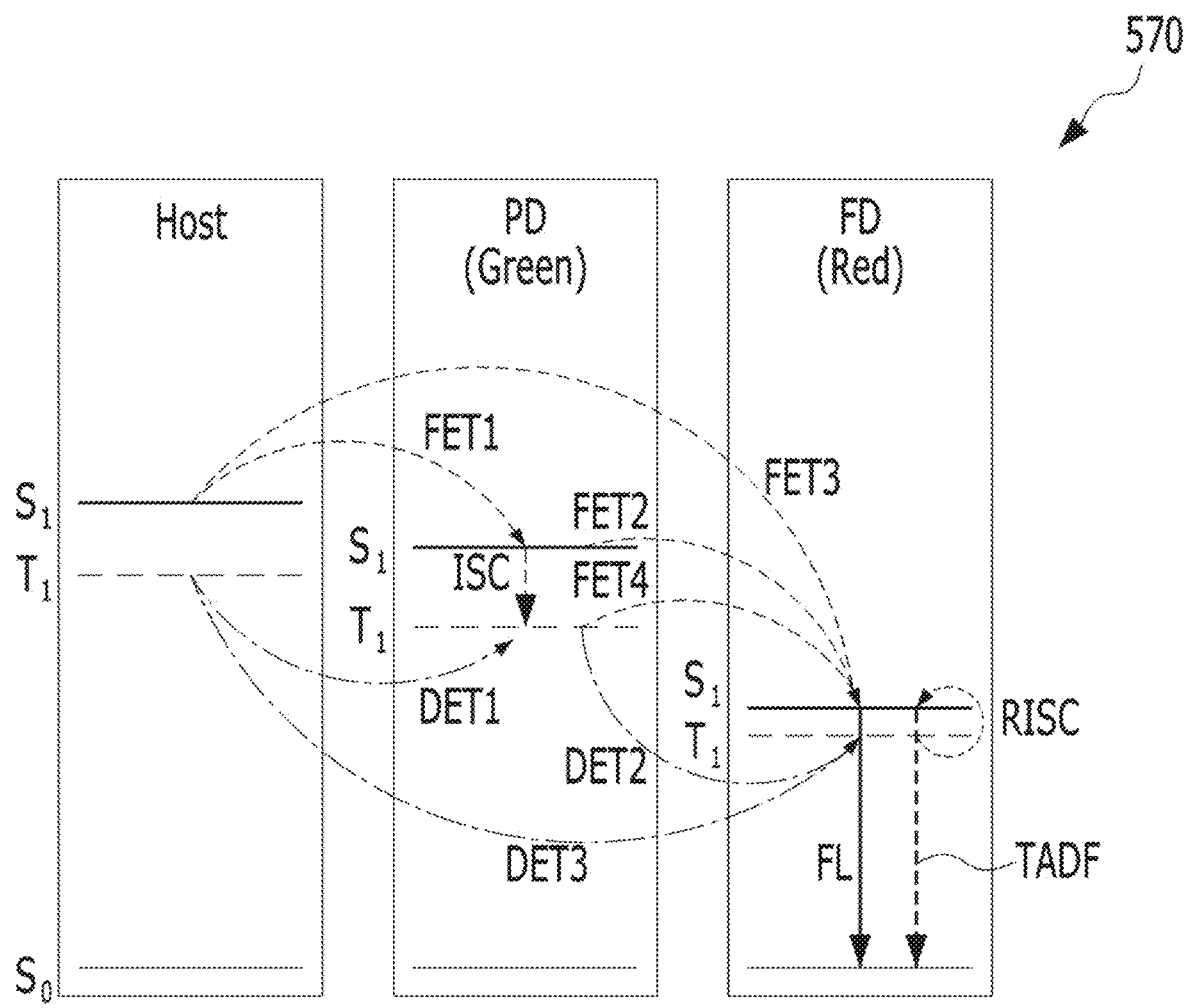
FIGS. 16A and 16B are a view illustrating energy transfer relation and a graph showing the PL spectrums in the light emitting layer according to an eleventh embodiment of the present disclosure.
Figure 16B:
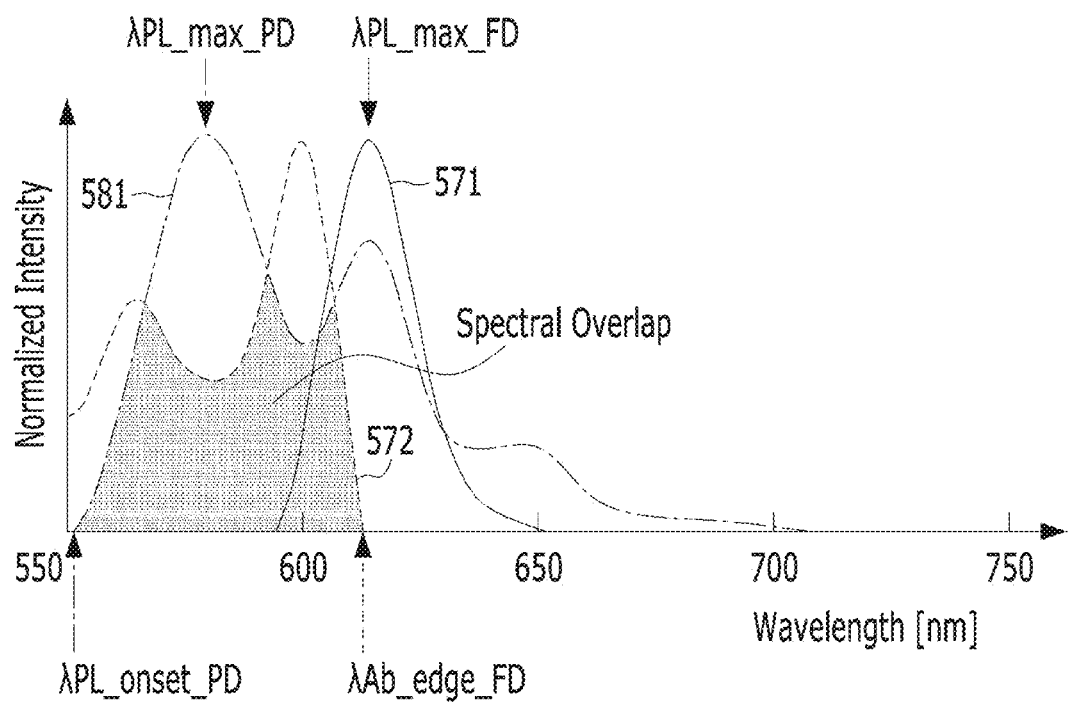

FIGS. 16A and 16B are a view illustrating energy transfer relation and a graph showing the PL spectrums in the light emitting layer according to an eleventh embodiment of the present disclosure.

As shown in FIG. 16A, the organic light emitting device according to the eleventh embodiment of the present disclosure includes a red light emitting layer 570. Also, the red light emitting layer 560 includes at least one host Host, a first dopant PD (Green) to which energy is transferred from the host, and a second dopant FD (Red) to which energy is transferred from the host and the first dopant.

The eleventh embodiment is different from the tenth embodiment in that the first dopant PD (Green) has green emission properties, not red emission properties. In this case, as shown in FIG. 16B, in the red light emitting layer 570 of the organic light emitting device according to the eleventh embodiment of the present disclosure, the peak wavelength of the PL spectrum 571 of the second dopant FD (Red) has a difference of 30 nm to 60 nm from the PL peak wavelength of the PL spectrum 581 of the first dopant PD (Green), and the first dopant PD (Green) and the second dopant FD (Red) have the different emission properties. However, in the organic light emitting device according to the eleventh embodiment of the present disclosure, from the first dopant PD (Green) to the second dopant FD (Red), energy transfers from the first dopant PD (Green) to the second dopant FD (Red) is facilitated by the big spectral overlap with the Förster energy transfer and thus fluorescence are generated at the second dopant. In addition, in the second dopant FD (Red), the TADF is generated with the Dexter energy transfer DET2 according to electron exchange of triplet excitons between the host Host and first dopant PD (Green), and the second dopant FD (Red) and the Reverse Intersystem Crossing (RICS) transfer between the triplet excited state T1 to the single excited state S1. Therefore, the red light emitting layer of the organic light emitting device according the eleventh embodiment may represent emission at approximately 600 nm to 700 nm.

The energy transfer and excitation mechanism of each component in the light emitting layer 130 are the same as those of FIGS. 1 to 3, and descriptions of the same parts are omitted.

Figure 17A:
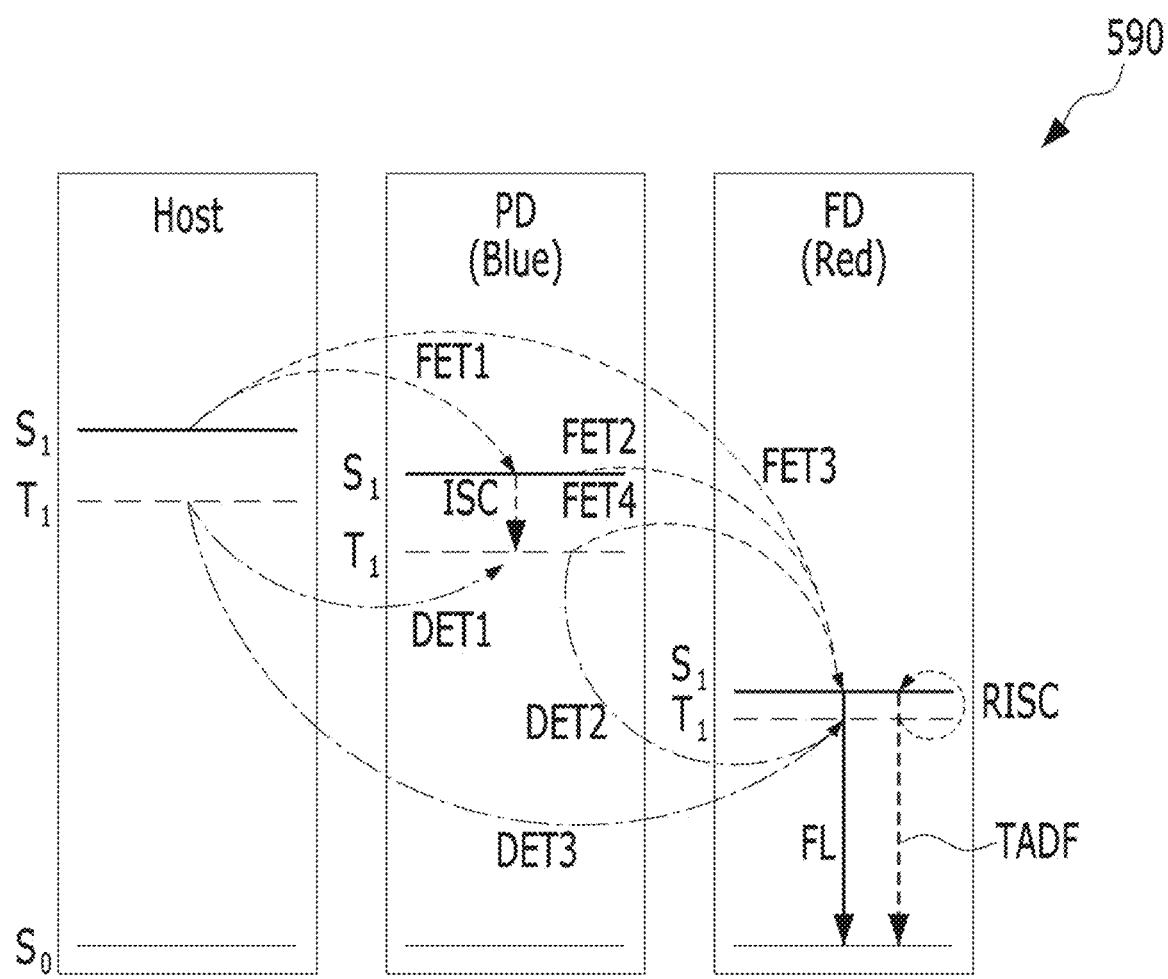
FIGS. 17A and 17B are a view illustrating energy transfer relation and a graph showing the PL spectrums in the light emitting layer according to a twelfth embodiment of the present disclosure.
Figure 17B:
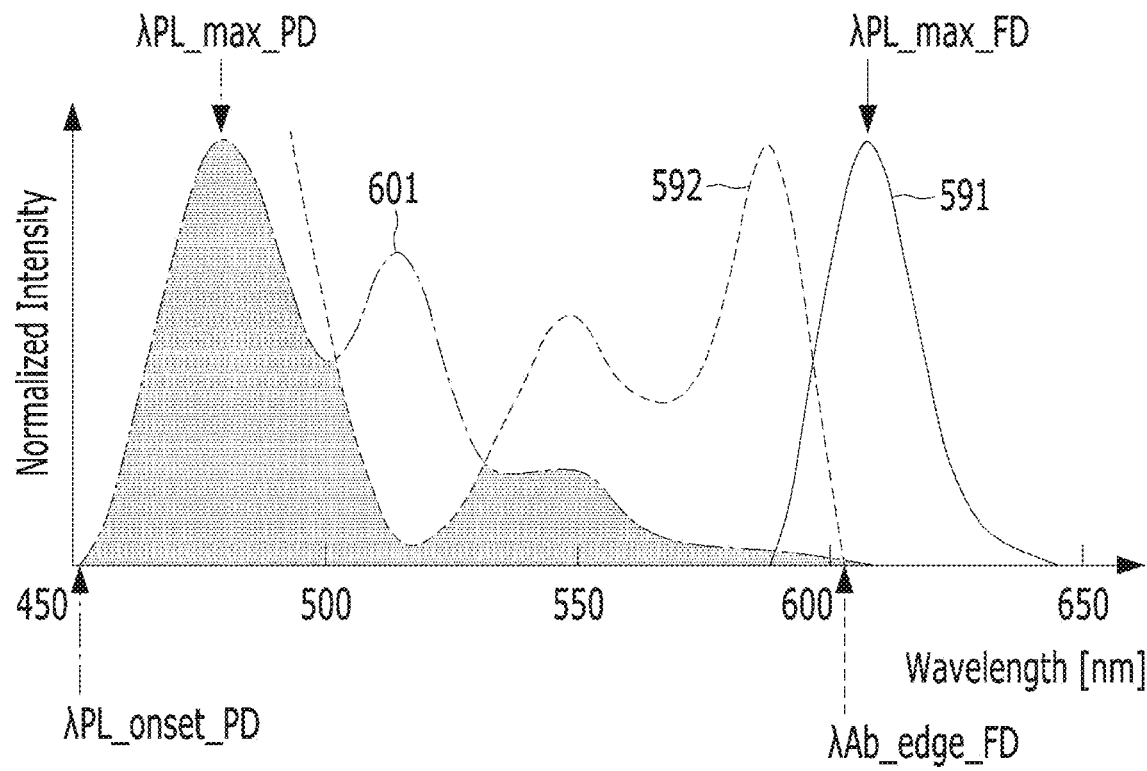

FIGS. 17A and 17B are a view illustrating energy transfer relation and a graph showing the PL spectrums in the light emitting layer according to a twelfth embodiment of the present disclosure.

As shown in FIG. 17A, the organic light emitting device according to the twelfth embodiment of the present disclosure includes a red light emitting layer 590. Also, the red light emitting layer 590 includes at least one host Host, a first dopant PD (Blue) to which energy is transferred from the host, and a second dopant FD (Red) to which energy is transferred from the host and the first dopant PD (Blue).

The twelfth embodiment is different from the tenth embodiment in that the first dopant PD (Blue) has blue emission properties, not red emission properties. In this case, as shown in FIG. 17B, in the red light emitting layer 590 of the organic light emitting device according to the ninth embodiment of the present disclosure, the peak wavelength of the PL spectrum 591 of the second dopant FD (Red) has a difference of 100 nm to 160 nm from the PL peak wavelength of the PL spectrum 601 of the first dopant PD (Blue), and the first dopant PD (Blue) and the second dopant FD (Red) have the different emission properties. However, in the organic light emitting device according to the twelfth embodiment of the present disclosure, from the first dopant PD (Blue) to the second dopant FD (Red), energy transfers from the first dopant PD (Blue) to the second dopant FD (Red) is facilitated by the big spectral overlap with the Förster energy transfer and thus fluorescence are generated at the second dopant. In addition, in the second dopant FD (Red), the TADF is generated with the Dexter energy transfer DET2 according to electron exchange of triplet excitons between the host Host and first dopant PD (Blue), and the second dopant FD (Red) and the Reverse Intersystem Crossing (RICS) transfer between the triplet excited state T1 to the single excited state S1. Therefore, the red light emitting layer of the organic light emitting device according the twelfth embodiment may represent emission at approximately 600 nm to 700 nm.

The energy transfer and excitation mechanism of each component in the light emitting layer 130 are the same as those of FIGS. 1 to 3, and descriptions of the same parts are omitted.

Hereinafter, an example of implementing a display device including a white organic light emitting device in the tandem device of the fifth or sixth embodiments as shown in FIGS. 9A and 9B of the present disclosure will be described.

Figure 18:
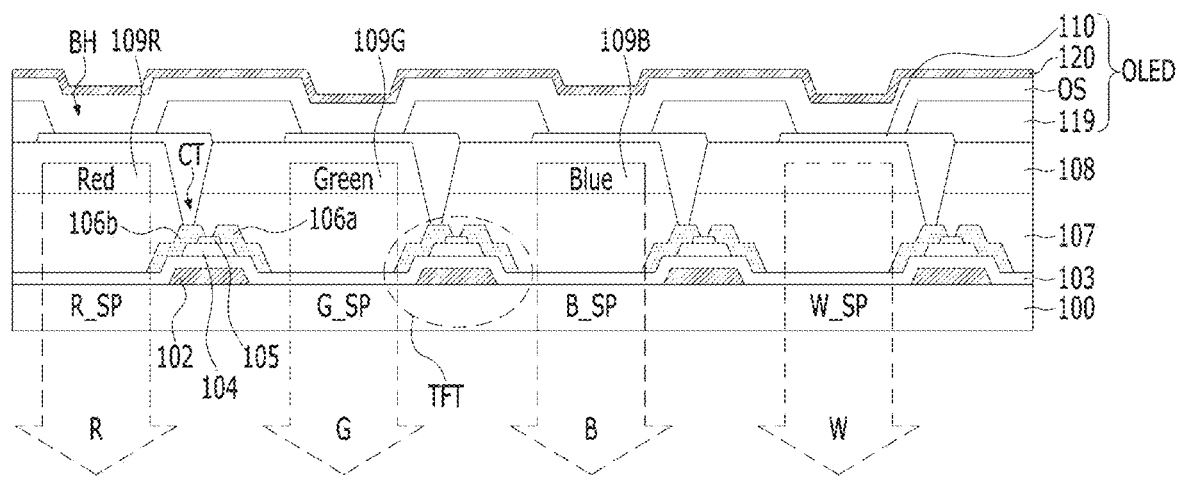
FIG. 18 is a cross-sectional view illustrating a display device according to the present disclosure.

FIG. 18 is a cross-sectional view illustrating a display device according to the present disclosure.

As shown in FIG. 18, the display device according to the present disclosure may include a substrate 100 having a plurality of subpixels R_SP, G_SP, B_SP and W_SP, the organic light emitting diodes OLEDs of FIG. 9A or FIG. 9B provided in common on the substrate 100, thin film transistors TFTs respectively provided in the subpixels and connected to the first electrode 110 of the organic light emitting diodes OLEDs, and a color filter layer 109R, 109G and 109B provided under the first electrode 110 of at least one of the subpixels.

Although the illustrated example shows that the display device includes a white subpixel W_SP, the disclosure is not limited thereto, and the display device may have a structure including only red, green and blue subpixels R_SP, G_SP and B_SP without the white subpixel W_SP. As circumstances require, a combination of a cyan subpixel, a magenta subpixel and a yellow subpixel, which are combined to express white, may be used as a substitute for the red, green and blue subpixels R_SP, G_SP and B_SP.

The thin film transistor TFT includes, for example, a gate electrode 102, a semiconductor layer 104, and a source electrode 106a and a drain electrode 106b connected to both sides of the semiconductor layer 104.

A gate insulating film 103 is provided between the gate electrode 102 and the semiconductor layer 104.

The semiconductor layer 104 may be formed of, for example, amorphous silicon, polycrystalline silicon, an oxide semiconductor, or a combination of two or more thereof. For example, if the semiconductor layer 104 is formed of an oxide semiconductor, an edge stopper 105 directly contacting the upper surface of the semiconductor layer 104 may be further provided so as to prevent damage to a channel region of the semiconductor layer 104.

Further, the drain electrode 106b of the thin film transistor TFT may be connected to the first electrode 110 by a contact hole CT formed within first and second protective films 107 and 108.

The first protective film 107 is provided so as to primarily protect the thin film transistors TFT, and color filters 109R, 109G and 109B may be provided on the upper surface of the first protective film 107.

When the subpixels include the red subpixel R_SP, the green subpixel G_SP, the blue subpixel B_SP and the white subpixel W_SP, first and third color filters 109R, 109G and 109B divided from the color filter layer are provided in the remaining subpixels R_SP, G_SP and B_SP, except for the white subpixel W_SP, and transmit respective wavelengths of white light emitted via the first electrode 110. Further, the second protective film 108 is provided on the lower surface of the first electrode 110 so as to cover the first to third color filters 109R, 109G and 109B. The first electrode 110 is formed on the surface of the second protective film 108 except for the contact holes CT.

Here, the white organic light emitting diode OLED may include the first electrode 110 which is a transparent electrode, the second electrode 120 which is a reflective electrode arranged opposite the first electrode 110, and as shown in FIG. 9A, a two-stack structure including a blue light emitting stack and a long-wavelength (R/G or YG) light emitting stack or as shown in FIG. 9B, a three-stack structure including a first blue light emitting stack, a long-wavelength light emitting stack and a second blue light emitting stack.

Here, undescribed reference numeral 119 indicates banks, and BH between the banks 119 indicates bank holes. Light is emitted through an open area in the bank hole BH, and the bank hole BH defines an emission area of each subpixel.

For example, the display device shown in FIG. 18 may be a bottom emission-type display device.

However, the display device according to the present disclosure is not limited thereto, and may be implemented as a top emission-type display device by locating the color filter layer on the upper surface of the second electrode 120, forming the first electrode 110 of a reflective metal and forming the second electrode 110 of a transparent metal or a transflective metal in the structure of the display device shown in FIG. 18.

Alternatively, in the display device of FIG. 18, the color filter layer may be omitted. Or in the display device of FIG. 18, both the first and second electrodes 110 and 120 may be transparent electrodes to realize a transparent light emitting device.

Hereinafter, in a fourth experimental example to which the first embodiment of the present disclosure is applied, and in the first to seventh experimental examples in which the configuration of the light emitting layer is different compared thereto, internal quantum efficiencies, and emission spectrum characteristics are discussed.

FIGS. 19A to 19D cross-sectional views according to a fourth experimental example to a seventh experimental example.

Figure 19A:
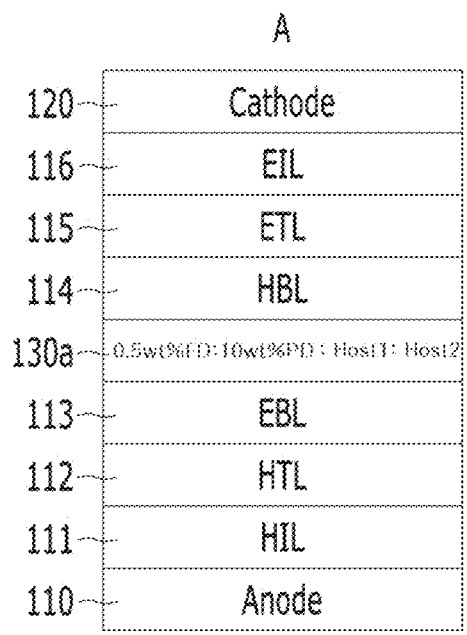
FIGS. 19A to 19D cross-sectional views according to a fourth experimental example to a seventh experimental example.
Figure 19B:
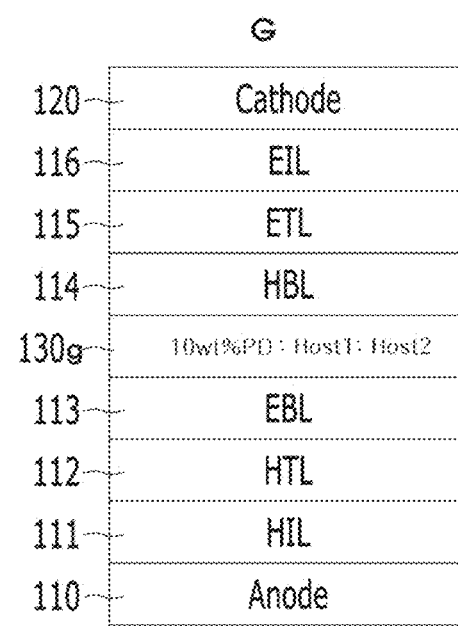
Figure 19C:
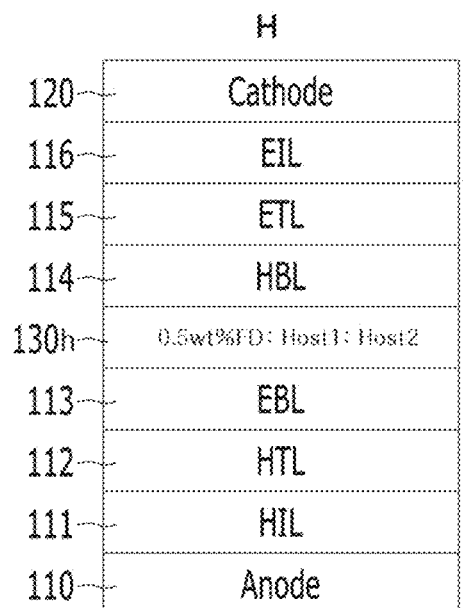
Figure 19D:
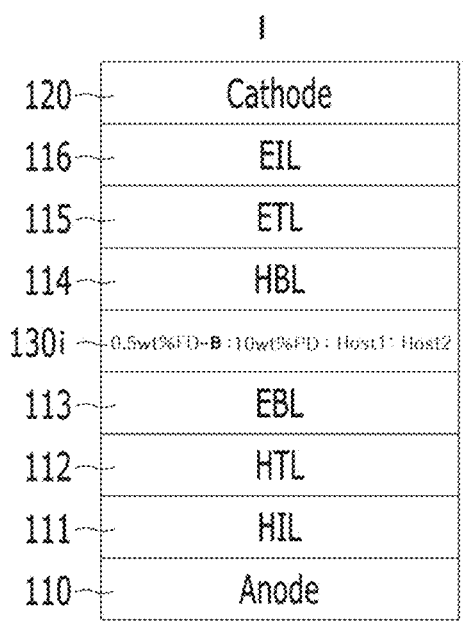

As shown in FIG. 19A, the fourth experimental example of the present disclosure has the same structure as the first embodiment of FIG. 5. And the fifth to seventh experimental examples of FIG. 19B to FIG. 19D have the same structure as the first embodiment of FIG. 5 except the light emitting layer.

Referring FIG. 19A, the organic light emitting device according to the fourth experimental example of the present disclosure is described.

As shown in FIG. 19A, the fourth experimental example of the present disclosure may be formed with the following order.

On a substrate (not shown), a first electrode 110 having a thickness of 50 nm is formed by depositing the Indium Tin Oxide (ITO).

On the first electrode 110, a hole injection layer 111 having a thickness of 15 nm is formed of a phthalocyanine compound or a starburst amine derivative with including a p-type dopant for facilitating hole injection. The p-type dopant, for an example, may be an organic compound such as HAT-CN or include a metal or a metal oxide.

On the hole injection layer 111, a hole transport layer 112 having a thickness of 25 nm is formed of an amine derivative such as NPB or NPD.

On the hole transport layer 112, an electron blocking layer 113 having a thickness of 10 nm is formed of an electron blocking material such as TAPC or like for blocking the electrons or excitons from the light emitting layer.

On the electron blocking layer 113, a light emitting layer 130a having a thickness of 30 nm is formed with 30 nm including a p-type host host1 having a high hole transport property and an n-type host host2 having a high electron transport property with the same ratio of 1:1, and a fluorescent dopant capable of TADF by a small ΔEst with 0.5 wt % and a phosphorescent dopant which is capable of transferring an energy to the fluorescent dopant with 10 wt %.

On the light emitting layer 130a, a hole blocking layer 114 having a thickness of 10 nm having a thickness of 10 nm is formed of a material such as B3PYMPM or phenanthroline, etc.

On the hole blocking layer 114, an electron transport layer 115 having a thickness of 25 nm is formed of anthracene compound and then, an electron injection layer 116 having a thickness of 1 nm is formed of the anthracene compound and inorganic material such as Li, LiF and MgF, etc., or inorganic compound.

On the electron injection layer 116, a second electrode 120 is formed of Al or Al alloy.

The electron blocking layer 113 and the hole blocking layer 114, respectively, have the material to confine the excitons within the light emitting layer 130a. That is, each singlet excited state and each triplet excited state of the materials of the electron blocking layer 113 and the hole blocking layer 114 is higher than or same as the singlet excited state and the triplet excited state of the p-type host Host1 and the n-type host Host2, respectively.

The light emitting layers 130g, 130h and 130i of the fifth to seventh experimental examples are different from the light emitting layer 130a.

The phosphorescent dopant PD of the light emitting layer according to the fourth experimental example uses, for example, a metal complex compound including, as a core, iridium (Ir), platinum (Pt), osmium (Os), gold (Au), titanium (Ti), zirconium (Zr), hafnium (Hf), europium (Eu), terbium (Tb), palladium (Pd) or thulium (Tm).

Also, the fluorescent dopant FD may be a boron-based compound, and in the experimental example, uses the above Chemical Formulas 6.

The light emitting layer 130g according to the fifth experimental example, having the thickness of 30 nm is formed including a p-type host host1 having a high hole transport property and an n-type host host2 having a high electron transport property with the same ratio of 1:1, and a single phosphorescent dopant with 10 wt % as a dopant.

The light emitting layer 130h according to the sixth experimental example, having the thickness of 30 nm is formed including a p-type host host1 having a high hole transport property and an n-type host host2 having a high electron transport property with the same ratio of 1:1, and a single fluorescent dopant with 0.5 wt % as a dopant. The fluorescent dopant FD in the sixth experimental example, has the same properties as the fluorescent dopant in the fourth experimental example and is formed of the boron-based compound capable of TADF such as the above Chemical Formulas 6.

The light emitting layer 130i according to the seventh experimental example, having the thickness of 30 nm is formed including a p-type host host1 having a high hole transport property and an n-type host host2 having a high electron transport property with the same ratio of 1:1, and a phosphorescent dopant with 10 wt % and a fluorescent dopant having no TADF with 0.5 wt % as a dopant.

TABLE 1

| Division | Peak wavelength (λmax[nm]) | Current density (at 10 mA/cm$^2$) | | | | Blue Index | Current density (at 5 mA/cm$^2$) LT90 (lifetime) |
| | | CIEx | CIEy | EQE(%) | Cd/A | | |
| --- | --- | --- | --- | --- | --- | --- | --- |
| The fourth experimental example(A) | 470 | 0.123 | 0.129 | 24.0 | 23.5 | 182 | 33 |
| The fifth experimental example(G) | 468 | 0.140 | 0.221 | 15.9 | 24.4 | 110 | 16 |
| The sixth experimental example(H) | 470 | 0.119 | 0.105 | 16.4 | 13.5 | 129 | 13 |
| The seventh experimental example(I) | 470 | 0.141 | 0.250 | 14.9 | 24.9 | 99 | 48 |

As shown in the Table 1, compared to the fifth experimental example using a single phosphorescent dopant or the sixth experimental example using a single fluorescent dopant, in the fourth experimental example (A) in which the first embodiment of the present disclosure is applied, the Förster energy transfer is mainly occurred, and thus the lifetime of the device is improved due to the reduction in the duration of the triplet, also the efficiency can also be improved, by using the excess triplets generated from the fluorescent dopant in the TADF emission. That is, the CIEy color coordinate of the fourth experimental example (A) is almost similar to the case of using the fluorescent dopant of the sixth experimental example (H), and the efficiency is similar to the case of using the phosphorescent dopant of the fifth experimental example (G). As a result, the fourth experimental example may realize an improved color purity of the fluorescent dopant and an improved efficiency of the phosphorescent dopant.

Figure 20:
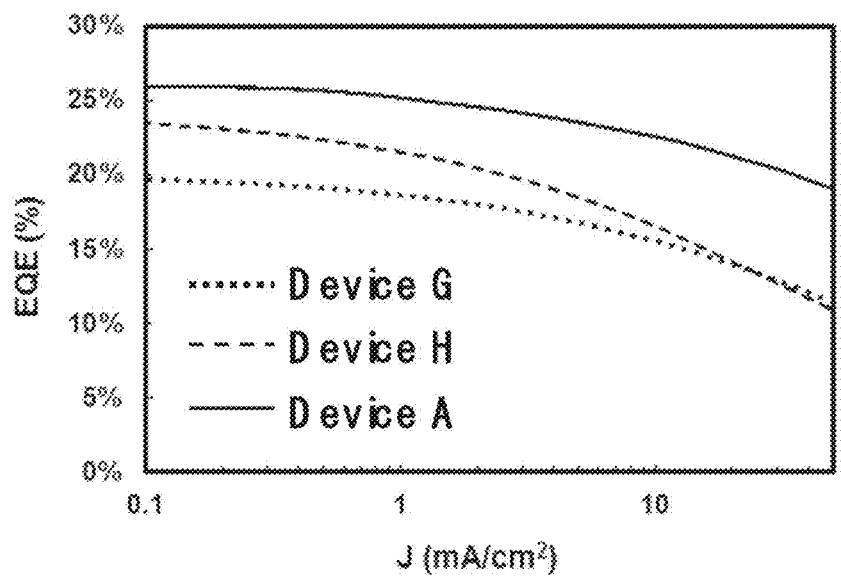
FIG. 20 is a graph showing external quantum efficiencies according to the fourth experimental example to the sixth experimental example.

In particular, considering a Blue Index value expressed in efficiency/CIEy, the fourth experimental example (A) is the best, and the lifetime determined as 90% luminance compared to the initial state is more than twice that of the fifth experimental example (G), and almost third times that of the sixth experimental example (G). This means that there is a remarkable improvement in the lifespan. On the other hand, the 7th experimental Example (I) uses the fluorescent dopant having no TADF compared to experimental Example 4. In the seventh experimental example (I), the blue color efficiency is decreases since the CIEy value is increasing since the fluorescent dopant having no TADF represents a wide FWHM. In addition, Forster energy transfer from the phosphorescent dopant to the fluorescent dopant decreases the lifetime of the triplet excitons, thereby increasing the device lifetime, whereas the triplet excitons of the fluorescent dopant are non-luminous and disappears, thus the efficiency decreases compared to the fifth experimental example of the pure phosphorescent device. FIG. 20 is a graph showing external quantum efficiencies according to the fourth experimental example to the sixth experimental example and FIG. 21 is a graph showing EL characteristics of the fourth experimental example to the sixth experimental example.

As shown in FIG. 20, when comparing the external quantum efficiency (EQE) characteristics in the fourth to sixth experimental examples (A, G, H), according to the change of the current density, the change of the external quantum efficiency (EQE) characteristics is the biggest in the sixth experimental example using a fluorescent dopant. And relatively, the fourth and fifth experiment examples (A and G) represent gentle change in the change of the external quantum efficiency (EQE) characteristics. That is, it can be seen that the external quantum efficiency is the best and the characteristics of color coordinate is not reversed in the fourth experimental example (A) among the experimental examples.

Figure 21:
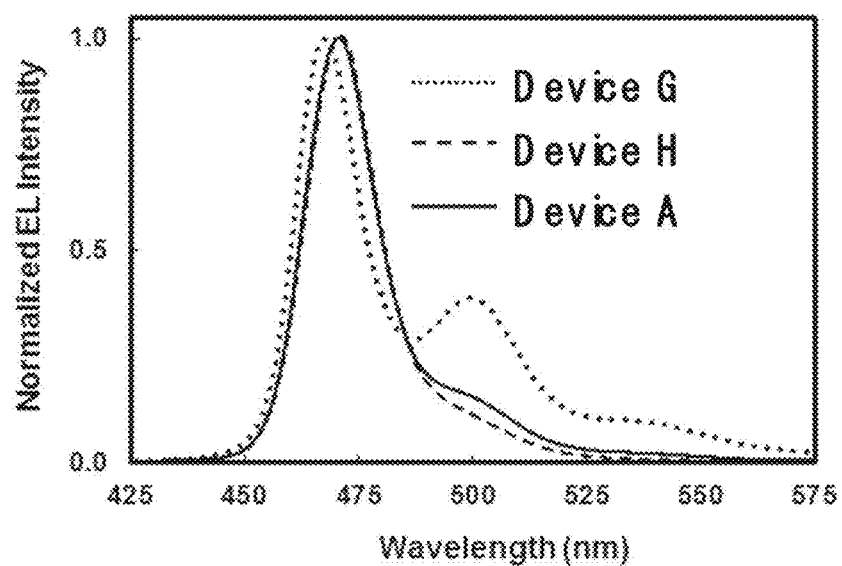
FIG. 21 is a graph showing EL characteristics of the fourth experimental example to the sixth experimental example.

As shown in FIG. 21, the EL spectrums of the fourth to sixth experimental examples (A, G, H) represent different emission properties, even providing the single blue light emitting layer.

In the fifth experimental example (G), only phosphorescent dopant as the dopant is provided. In this case, the phosphorescent blue dopant has a vibronic peak characteristic, and the main peak and a side peak simultaneously appear. Thus, the spectrum wavelength range is wide, and the color purity is poor. Also, a partial light emission appears in the green wavelength.

On the other hand, in the fourth experimental example (A) and the sixth experimental example (H), by using a fluorescent dopant having such a narrow spectrum, high color purity can be expressed. Here, the fourth experimental example (A) and the sixth experimental example (H) have almost the same spectral shape. Similarly, it means that most of the energy of the phosphorescent dopant inside the light emitting layer is transferred to the fluorescent dopant, and thus fluorescence emission occurred in the fourth experimental example (A).

As described above, the fourth experimental example (A) to which the first embodiment of the present disclosure is applied, is beneficial in terms of high color purity, long life, and high efficiency.

In addition, for the fourth experimental example (A) and the fifth experimental example (B) to which the first embodiment of the present disclosure are applied, decay times which excitons have been used for light emission are compared. The decay time of the fourth experimental example (A) is 0.7 s and the fifth experimental example (G) is 4.2 s. The fourth experimental example (A) including a fluorescent dopant capable of TADF and a phosphorescent dopant as a dopant has a faster times more than 6 times than the fifth experimental example (G) including only phosphorescent dopant. So the fourth experimental example (A) is possible to transfer the triplet excited state of the phosphorescent dopant to the singlet excited state of the fluorescent dopant in a short time. And it is expected the fourth experimental example (A) solves the problem that the triplet excitons of the phosphorescent dopant are remained in the light emitting layer and the remained triplet exciton reduces the lifetime of the light emitting layer. As described above, the organic light-emitting device of the present disclosure and a display device using the same are characterized in that the light emitting layer includes phosphorescent and fluorescent dopants having the same or different colors, and thus excitons formed through the phosphorescent dopant are fully or almost transferred to the fluorescent dopant to induce monochromatic fluorescence.

The organic light emitting device according to the first to fourth embodiments have common feature to use the first and second dopants of different properties and to select the second dopant capable of fluorescence emission with TADF, thus the organic light emitting device according to the first to fourth embodiments have the common effect to emit uni-color light.

As described above, an organic light emitting device according to the present disclosure may comprises a light emitting layer provided between a first electrode and a second electrode arranged opposite each other. The light emitting layer may comprises at least one host, a first dopant to which energy is transferred from the host and a second dopant to which energy is transferred from the host and the first dopant. A thermally activated delayed fluorescence (TADF) may be generated through a reverse intersystem crossing transfer from the triplet excited state to the singlet excited state in the second dopant.

The first dopant may be a phosphorescent dopant, and the second dopant may be a fluorescent dopant. Also, in the light emitting layer, a main emission may be generated from the second dopant.

The TADF and a fluorescence emission may be generated together when energy is emitted from the singlet excited state of the second dopant into a ground state.

An absorption spectrum of the second dopant and a PL (Photoluminescence) spectrum of the first dopant may overlap at least 15 nm or more, and a max wavelength of the absorption spectrum of the second dopant may be longer than a minimum wavelength of the PL spectrum of the first dopant.

The energy may be transferred from the first dopant to the second dopant by overlapping the absorption spectrum of the second dopant with the PL spectrum of the first dopant.

The PL spectrum of the first dopant may be positioned between a peak wavelength of the absorption spectrum of the second dopant and an emission peak wavelength of a PL spectrum of the second dopant.

An emission peak of the PL spectrum of the first dopant may have a difference within 30 nm from an emission peak of a PL spectrum of the second dopant.

The second dopant may have a singlet energy level having a difference of 0.4 eV or less with the triplet energy level of the second dopant.

A Forster energy transfer (FET) may be bigger than an energy transfer (DET) in the energy transfer from the first dopant to the second dopant.

The reverse intersystem crossing (RISC) transfer from the triplet excited state to the singlet excited state in the second dopant may be proportional to a Dexter energy from the host and the first dopant to the second dopant, and an energy of triplet excitons generated in the second dopant.

A triplet energy state of the host may be higher than or equal to a triplet energy state of the first dopant, and the triplet energy state of the first dopant may be higher than or equal to the triplet energy state of the second dopant.

The triplet energy state of the first dopant may be higher than or equal to the single energy state of the second dopant.

A first difference between the singlet energy state and the triplet energy state of the second dopant may be smaller than a second difference between the singlet energy state and the triplet energy state of the host and a third difference between the singlet energy state and the triplet energy state of the first dopant, respectively.

The organic light emitting device may further comprises at least one common layer between the first electrode and the light emitting layer, and between the second electrode and the light emitting layer. The at least one common layer contacting the light emitting layer may comprise a material having a triplet energy level higher than or equal to a triplet energy level of the at least one host.

The light emitting layer may comprise 50 wt % or more of the at least one host, 1 wt % to 40 wt % of the first dopant and 0.01 wt % to 10 wt % of the second dopant.

The host may comprise a plurality of hosts having different carrier transport characteristics.

Further, a display device according to the present disclosure in order to achieve the similar benefits may comprise a substrate comprising a plurality of subpixels, a thin film transistor in each of the subpixels, and an organic light emitting device in each of the subpixels connected to the thin film transistor. The organic light emitting device may comprise a first electrode and a second electrode arranged opposite each other, and at least one light emitting layer between the first and second electrodes. The at least one light emitting layer may comprise at least one host, a first dopant to which energy is transferred from the host and a second dopant to which energy is transferred from the host and the first dopant. TADF (thermally activated delayed fluorescence) is generated through a reverse intersystem crossing (RISC) transfer from the triplet excited state to the singlet excited state in the second dopant.

The display device may comprise a plurality of stacks divided by a charge generation layer therebetween, and each of the stacks includes at least one common layer. The at least one light emitting layer may be in at least one stack among the plurality of stacks.

The light emitting layer in at least one stack may comprises at least one host, a first dopant to which energy is transferred from the host and a second dopant to which energy is transferred from the host and the first dopant. A thermally activated delayed fluorescence (TADF) may be generated through a reverse intersystem crossing transfer from the triplet excited state to the singlet excited state in the second dopant.

The first dopant may be a phosphorescent dopant, and the second dopant may be a fluorescent dopant, and in the light emitting layer, a main emission may be generated from the second dopant.

The TADF and a fluorescence emission may be generated together when energy is emitted from the singlet excited state of the second dopant into a ground state.

An absorption spectrum of the second dopant and a PL (Photoluminescence) spectrum of the first dopant may overlap at least 15 nm or more, and a max wavelength of the absorption spectrum of the second dopant may be longer than a minimum wavelength of the PL spectrum of the first dopant.

In the display device, the stacks may comprise a blue light emitting stack comprising at least one blue light emitting layer comprising the host, the first dopant and the second dopant and a long-wavelength light emitting stack arranged opposite to the first blue light emitting stack interposing the charge generation layer between the blue light emitting stack and the long-wavelength light emitting stack, the long-wavelength light emitting stack to emit light of wavelengths longer than blue wavelength.

The display device may further comprising a plurality of color filter layers under the first electrode or on the second electrode to emit light of different colors in the respective subpixels.

The long-wavelength light emitting stack may comprise a red light emitting layer and a green light emitting layer, and at least one of the red light emitting layer and the green light emitting layer may comprise a host, and a plurality of dopants. Energy may be transferred from the host and dopants to one dopant.

The stacks may comprise a plurality of first blue light emitting stacks.

As is apparent from the above description, an organic light emitting device and a display device using the same according to the present disclosure have the following effects.

First, different kinds of dopants, e.g., a phosphorescent dopant and a fluorescent dopant, are used, energy transfer is concentrated upon the fluorescent dopant, and almost all of light emission is generated due to excitation in the singlet energy level of the fluorescent dopant through fluorescence of the fluorescent dopant itself and delayed fluorescence, thereby being capable of improving luminous efficacy of a single color. Therefore, even when different kinds of dopants are used, emission of light of a single color may be realized and color purity of the organic light emitting device may be improved. Energy may be concentrated upon the singlet energy level of the fluorescent dopant from the triplet energy level of the fluorescent dopant through reverse intersystem crossing (RISC).

Second, the fluorescent dopant receives energy from the phosphorescent dopant and the host through the mechanisms of Dexter energy transfer (DET) and Förster energy transfer (FET), and fluorescence of the fluorescent dopant itself, caused by transition of excitons from the singlet energy level to the ground state, and thermally activated delayed fluorescence (TADF), caused through reverse intersystem crossing (RISC) due to a slight energy level difference ΔEst between the triplet excited state and the singlet excited state, occur in the fluorescent dopant, thereby being capable of improving internal quantum efficiency of the excitons.

Third, when the phosphorescent dopant is used as a dopant configured to transmit energy and the fluorescent dopant is used as a dopant configured to receive energy, energy transfer between the different kinds of dopants is realized through Dexter energy transfer (DET) and thus the triplet energy level of the phosphorescent dopant does not need to be higher than the singlet energy level of the fluorescent dopant, and thereby, energy may be transferred from the phosphorescent dopant having a lower triplet energy level to the fluorescent dopant in which thermally activated delayed fluorescence (TADF) may occur. Therefore, the phosphorescent dopant is not limited to a high triplet energy level, and thus a phosphorescent dopant structure having stability in the material therefor may be ensured.

Fourth, in the present disclosure, it is possible to increase the spectral overlap between the absorption spectrum of the fluorescent dopant and the PL spectrum of the phosphorescent dopant for the energy transfer due to a small Stokes shift between the peak wavelength of the PL spectrum and the peak wavelength of the absorption spectrum in the fluorescent dopant. So the triplets generated in the phosphorescent dopant are fast transferred to the fluorescent dopant, therefore, the duration of the triplets may be reduced and then may increase the lifetime of the device.

It will be apparent to those skilled in the art that various modifications and variations can be made in the present disclosure without departing from the spirit or scope of the invention. Thus, it is intended that the present disclosure cover the modifications and variations of this invention provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting device, comprising:
a second electrode opposite a first electrode; and
a light emitting layer on the first electrode, the light emitting layer being a single layer,
wherein:
the light emitting layer includes at least one host, a first dopant having a phosphorescent dopant, and a second dopant having a fluorescent dopant;
a main emission in the light emitting layer is generated from the second dopant; and
a PL spectrum of the first dopant is between a peak wavelength of an absorption spectrum of the second dopant and an emission peak wavelength of a PL spectrum of the second dopant.

2. The organic light emitting device according to claim 1, wherein the absorption spectrum of the second dopant and the photoluminescence (PL) spectrum of the first dopant overlap at least 15 nm or more.

3. The organic light emitting device according to claim 1, wherein a max wavelength of the absorption spectrum of the second dopant is longer than a minimum wavelength of the PL spectrum of the first dopant.

4. The organic light emitting device according to claim 1, wherein an emission peak of the PL spectrum of the first dopant has a difference within 30 nm from an emission peak of a PL spectrum of the second dopant.

5. The organic light emitting device according to claim 1, wherein the second dopant has a singlet energy level having a difference of 0.4 eV or less with a triplet energy level of the second dopant.

6. The organic light emitting device according to claim 1, wherein:
a triplet energy state of the host is higher than or equal to a triplet energy state of the first dopant; and
the triplet energy state of the first dopant is higher than or equal to the triplet energy state of the second dopant.

7. The organic light emitting device according to claim 6, wherein the triplet energy state of the first dopant is higher than or equal to the single energy state of the second dopant.

8. The organic light emitting device according to claim 6, wherein a first difference between the singlet energy state and the triplet energy state of the second dopant is smaller than a second difference between the singlet energy state and the triplet energy state of the host and a third difference between the singlet energy state and the triplet energy state of the first dopant, respectively.

9. The organic light emitting device according to claim 1, further comprising:
at least one common layer between the first electrode and the light emitting layer, and between the second electrode and the light emitting layer,
wherein the at least one common layer contacting the light emitting layer comprises a material having a triplet energy level higher than or equal to a triplet energy level of the at least one host.

10. The organic light emitting device according to claim 1, wherein the light emitting layer comprises:
50 wt % or more of the at least one host;
1 wt % to 40 wt % of the first dopant; and
0.01 wt % to 10 wt % of the second dopant.

11. The organic light emitting device according to claim 1, wherein the at least one host comprises a plurality of hosts having different carrier transport characteristics.

12. A display device, comprising:
a substrate having a plurality of subpixels;
a thin film transistor in each of the subpixels; and
an organic light emitting device in each of the subpixels connected to the thin film transistor,
wherein:
the organic light emitting device includes a first electrode and a second electrode arranged opposite to each other, and at least one light emitting layer between the first and second electrodes;
the at least one light emitting layer as a single layer includes:
at least one host,
a first dopant includes a phosphorescent dopant, and
a second dopant includes a fluorescent dopant;

a main emission of the light emitting layer is generated from the second dopant; and a photoluminescence (PL) spectrum of the first dopant is between a peak wavelength of an absorption spectrum of the second dopant and an emission peak wavelength of a PL spectrum of the second dopant.

13. The display device according to claim 12, wherein:

the organic light emitting device includes a plurality of stacks divided by a charge generation layer therebetween;

each of the stacks includes at least one common layer; and the at least one light emitting layer is in at least one stack among the plurality of stacks.

14. The display device according to claim 12, wherein the plurality of stacks includes at least one of first blue light emitting stacks.

* * * * *